United States Patent
Lee et al.

(10) Patent No.: US 10,825,907 B2
(45) Date of Patent: Nov. 3, 2020

(54) SELF-ALIGNED CONTACT AND MANUFACTURING METHOD THEREOF

(71) Applicant: Taiwan Semiconductor Manufacturing Company, Ltd., Hsinchu (TW)

(72) Inventors: Tung Ying Lee, Hsinchu (TW); Chih Chieh Yeh, Taipei (TW); Jeng-Ya David Yeh, New Taipei (TW); Yuan-Hung Chiu, Taipei (TW); Chi-Wen Liu, Hsinchu (TW); Yee-Chia Yeo, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 10 days.

(21) Appl. No.: 16/048,515

(22) Filed: Jul. 30, 2018

(65) Prior Publication Data
US 2018/0350927 A1 Dec. 6, 2018

Related U.S. Application Data

(62) Division of application No. 15/366,956, filed on Dec. 1, 2016, now Pat. No. 10,164,032.
(Continued)

(51) Int. Cl.
*H01L 21/283* (2006.01)
*H01L 29/417* (2006.01)
(Continued)

(52) U.S. Cl.
CPC .. *H01L 29/41791* (2013.01); *H01L 21/76804* (2013.01); *H01L 21/76897* (2013.01);
(Continued)

(58) Field of Classification Search
CPC ............... H01L 21/76804; H01L 29/41791
See application file for complete search history.

(56) References Cited

U.S. PATENT DOCUMENTS

| 5,723,381 A | 3/1998 | Grewal et al. |
| 7,667,271 B2 | 2/2010 | Yu et al. |
| (Continued) | | |

FOREIGN PATENT DOCUMENTS

| CN | 103915372 A | 7/2014 |
| KR | 20040037416 A | 5/2004 |
| (Continued) | | |

OTHER PUBLICATIONS

Auth, C., et al., "A 22 nm high performance and low-power CMOS technology featuring fully-depleted tri-gate transistors, self-aligned contacts and high density MIM capacitors," in Proc. Symp. VLSI Technology, Jun. 2012, pp. 131-132.
(Continued)

*Primary Examiner* — Bradley Smith
*Assistant Examiner* — David J Goodwin
(74) *Attorney, Agent, or Firm* — Slater Matsil, LLP

(57) ABSTRACT

A semiconductor device and a method of forming the semiconductor device is disclosed. A sacrificial film is used to pattern a contact to a semiconductor structure, such as a contact to a source/drain region of a transistor. The contact may include a tapered profile along an axis parallel to the gate electrode such that an outermost width of the contact decreases as the contact extends away from the source/drain region.

20 Claims, 28 Drawing Sheets

Related U.S. Application Data

(60) Provisional application No. 62/351,746, filed on Jun. 17, 2016.

(51) Int. Cl.
    *H01L 21/768*   (2006.01)
    *H01L 27/088*   (2006.01)
    *H01L 29/423*   (2006.01)
    *H01L 29/06*    (2006.01)
    *H01L 21/8234*  (2006.01)
    *H01L 29/66*    (2006.01)
    *H01L 29/78*    (2006.01)
    *H01L 29/04*    (2006.01)

(52) U.S. Cl.
    CPC ........... *H01L 21/823418* (2013.01); *H01L 21/823431* (2013.01); *H01L 21/823468* (2013.01); *H01L 21/823481* (2013.01); *H01L 27/0886* (2013.01); *H01L 29/0669* (2013.01); *H01L 29/0676* (2013.01); *H01L 29/42392* (2013.01); *H01L 29/66545* (2013.01); *H01L 29/66795* (2013.01); *H01L 29/785* (2013.01); *H01L 21/76837* (2013.01); *H01L 29/045* (2013.01)

(56) References Cited

U.S. PATENT DOCUMENTS

| | | | |
|---|---|---|---|
| 7,910,453 B2 | 3/2011 | Xu et al. | |
| 8,377,779 B1 | 2/2013 | Wang | |
| 8,399,931 B2 | 3/2013 | Liaw et al. | |
| 8,524,592 B1* | 9/2013 | Xie | H01L 29/78 257/387 |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,318,581 B1 | 4/2016 | Guo et al. | |
| 9,337,105 B1* | 5/2016 | Kwon | H01L 21/823475 |
| 9,466,723 B1 | 10/2016 | Huang et al. | |
| 9,583,351 B2* | 2/2017 | Wei | H01L 29/41791 |
| 2014/0001574 A1 | 1/2014 | Chen et al. | |
| 2014/0110755 A1 | 4/2014 | Colinge | |
| 2014/0151812 A1 | 6/2014 | Liaw | |
| 2014/0175529 A1 | 6/2014 | Park | |
| 2014/0231924 A1 | 8/2014 | Kuo et al. | |
| 2015/0060960 A1 | 3/2015 | Xie et al. | |
| 2015/0069532 A1 | 3/2015 | Xie et al. | |
| 2015/0137194 A1* | 5/2015 | Wei | H01L 21/283 257/288 |
| 2015/0145027 A1 | 5/2015 | Lin et al. | |
| 2015/0333148 A1 | 11/2015 | Koo et al. | |
| 2016/0043197 A1 | 2/2016 | Kim et al. | |
| 2016/0141384 A1 | 5/2016 | Lee et al. | |
| 2016/0172496 A1 | 6/2016 | Chang et al. | |
| 2016/0233298 A1 | 8/2016 | Webb et al. | |
| 2017/0033223 A1 | 2/2017 | Leobandung | |

FOREIGN PATENT DOCUMENTS

| | | |
|---|---|---|
| KR | 20120089357 A | 8/2012 |
| KR | 20140104811 A | 8/2014 |
| KR | 20140104881 A | 8/2014 |
| KR | 20150131447 A | 11/2015 |
| TW | 201427030 A | 7/2014 |
| TW | 201501299 A | 1/2015 |
| TW | 201533902 A | 9/2015 |
| TW | 201622141 A | 6/2016 |
| WO | 2011090571 A2 | 7/2011 |

OTHER PUBLICATIONS

Bangsaruntip, S., et al., "Density scaling with gate-all-around silicon nanowire MOSFETs for the 10 nm node and beyond," in Proc. IEEE International Electron Device Meeting, Dec. 2013, p. 385.

Chung, S.W., et al., "Novel shallow trench isolation process using flowable oxide CVD for sub-100nm DRAM," in Proc. IEEE International Electron Device Meeting, Dec. 2002, p. 223.

J. P. Colinge, "Multi-gate SOI MOSFETs," Solid-State Electronics, vol. 48, pp. 897, 2004.

Colinge, J. P., et al., "Junctionless nanowire transistor (JNT): Properties and design guidelines," Solid-State Electronics, vol. 65-66, pp. 33-37, 2011.

Hisamoto, D., et al., "FinFET—A self-aligned double-gate MOSFET scalable to 20 nm," IEEE Trans. Electron Devices, vol. 47, No. 12, pp. 2320-2325, Dec. 2000.

Huang, X., et al., "Sub-50 nm P-channel FinFET," IEEE Trans. Electron Devices, vol. 48, No. 5, pp. 880-886, May 2001.

Kavalieros, J., et al., "Tri-gate transistor architecture with high-k gate dielectrics, metal gates and strain engineering," in Proc. Symp. VLSI Technology, 2006, pp. 50-51.

Kedzierski, J., et al., "Extension and source/drain design for high performance FinFET devices," IEEE Trans. Electron Devices, vol. 50, No. 4, pp. 952-958, Apr. 2003.

Kedzierski, J., et al., Fabrication of metal gated FinFETs through complete gate silicidation with Ni, IEEE Trans. Electron Devices, vol. 51, No. 12, pp. 2115-2120, Dec. 2004.

Liow, T.Y., et al., "Strained N-channel FinFETs with 25 nm gate length and silicon-carbon source/drain regions for performance enhancement," in Proc. Symp. VLSI Technology, 2006, pp. 68-69.

Moon, D., et al., "Investigation of Silicon Nanowire Gate-All-Around Junctionless Transistors Built on a Bulk Substrate," IEEE Trans. Electron Devices, vol. 60, No. 4, pp. 1355-1360, Apr. 2013.

Park, J. T., et al., "Multiple-gate SOI MOSFETs: Device design guidelines," IEEE Trans Electron Dev, vol. 49, pp. 2222, 2002.

Takato, H., et al., "High performance CMOS surrounding gate transistor (SGT) for ultra high density LSIs," in Proc. IEEE International Electron Device Meeting, Dec. 1988, p. 222.

Yang, F.L., et al., "25 nm CMOS Omega FET," in Proc. IEEE International Electron Device Meeting, 2002, pp. 255.

Yeh, C.C., et al., "A low operating power FinFET Transistor module featuring scaled gate stack and strain engineering for 32/28 nm SoC technology," in Proc. IEEE International Electron Device Meeting, Dec. 2010, p. 772.

\* cited by examiner

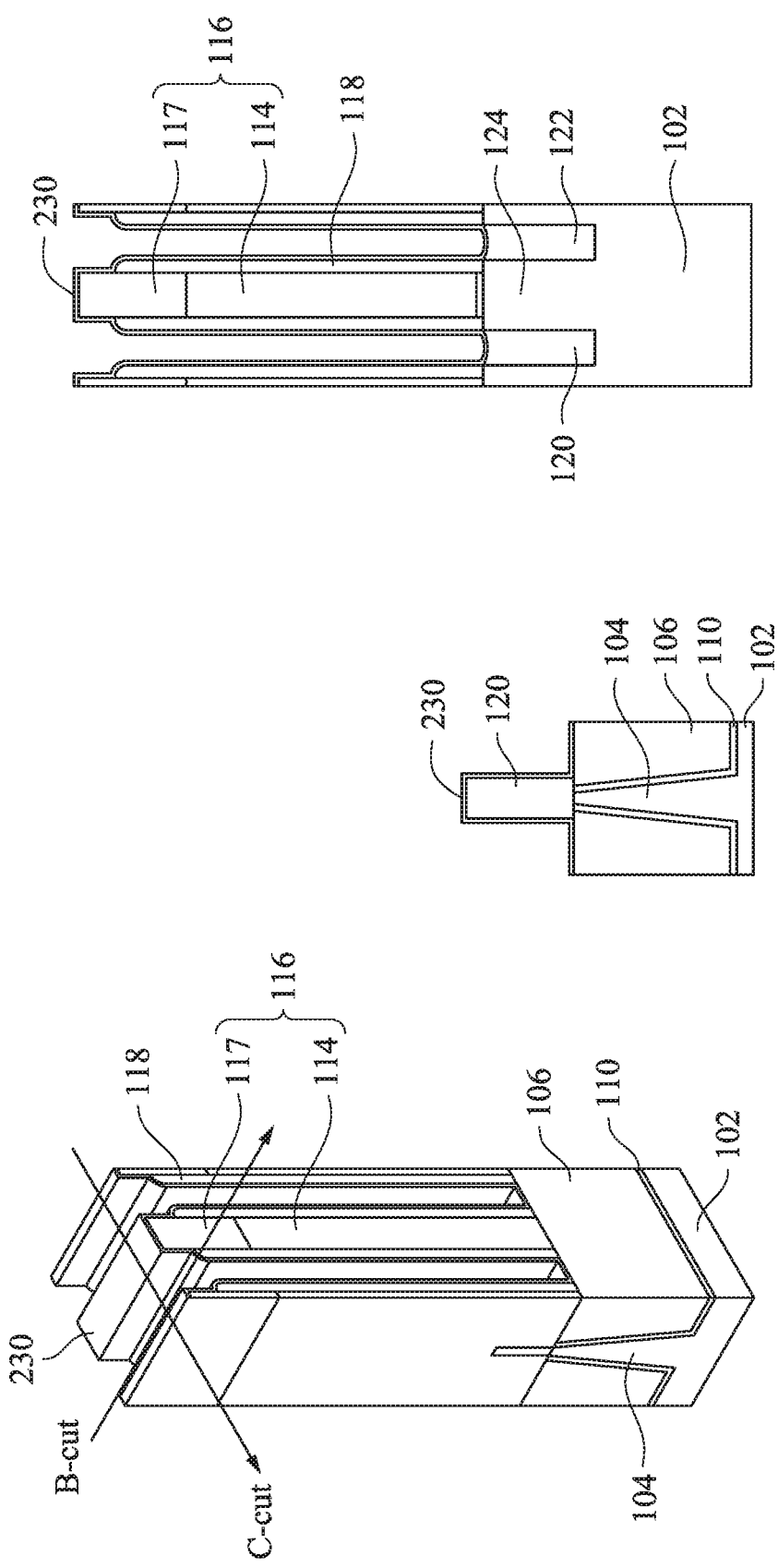

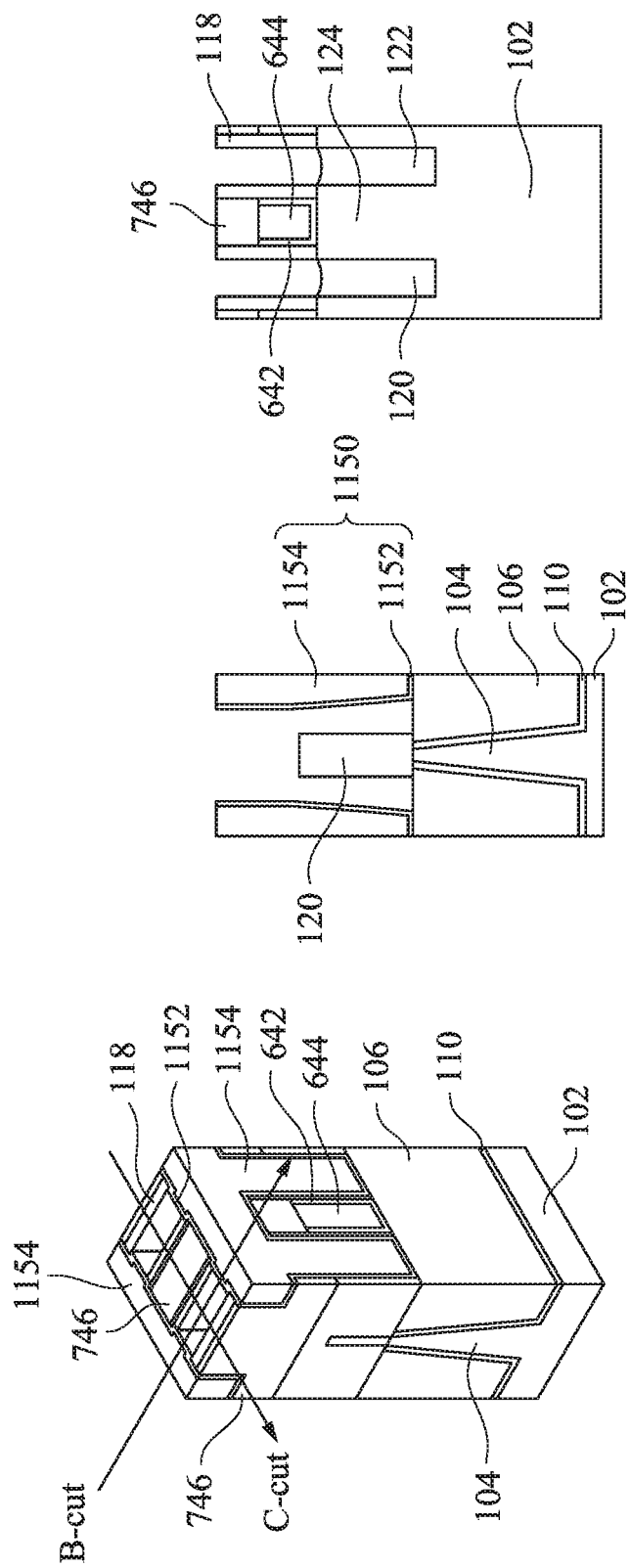

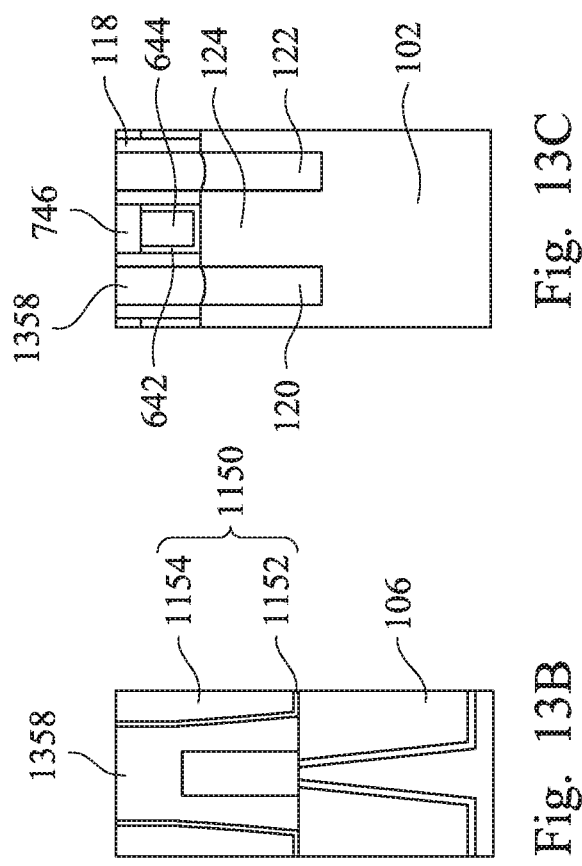
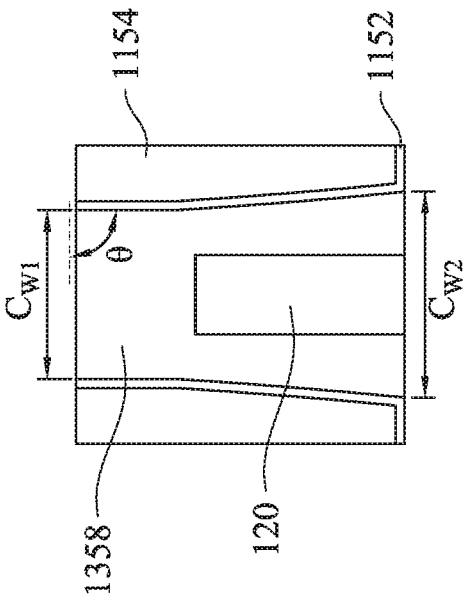
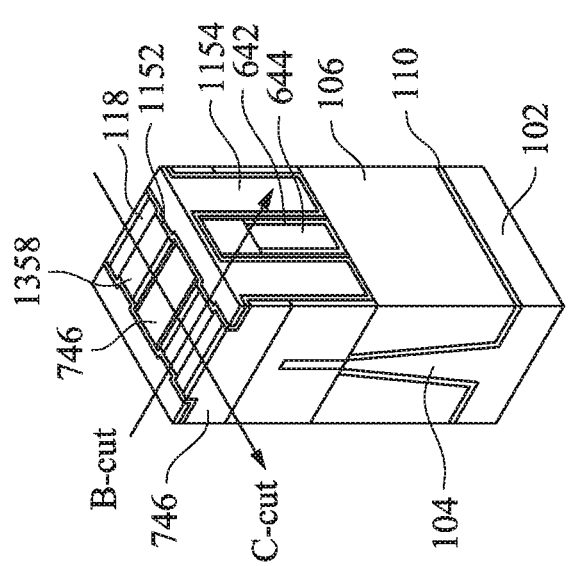
Fig. 13A  Fig. 13B  Fig. 13C  Fig. 13D

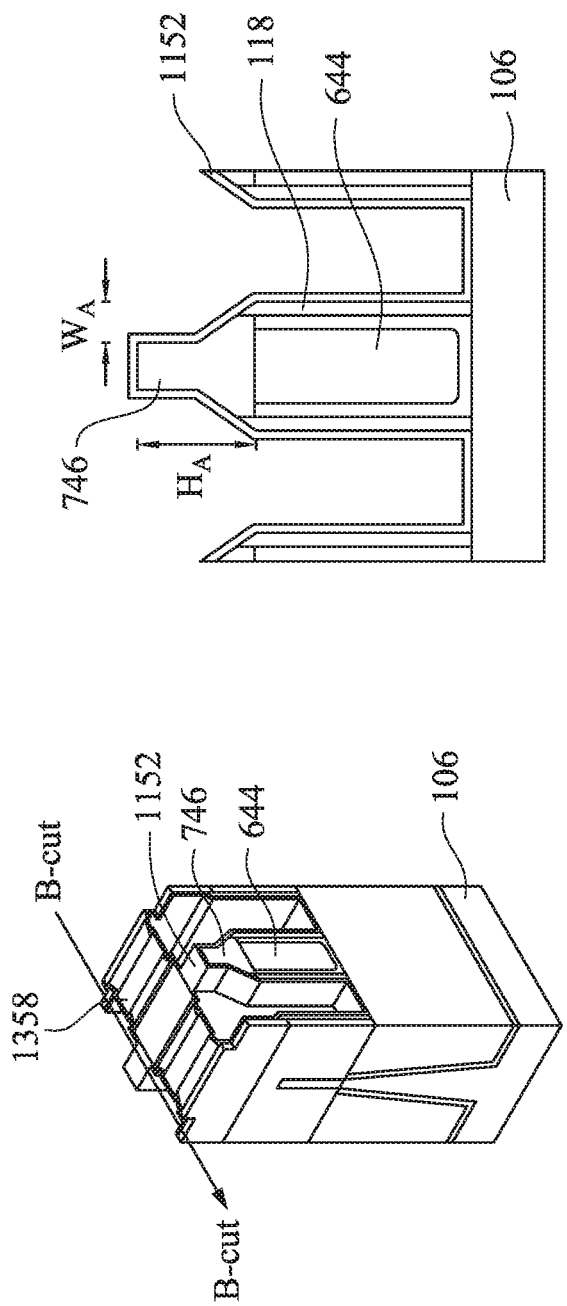

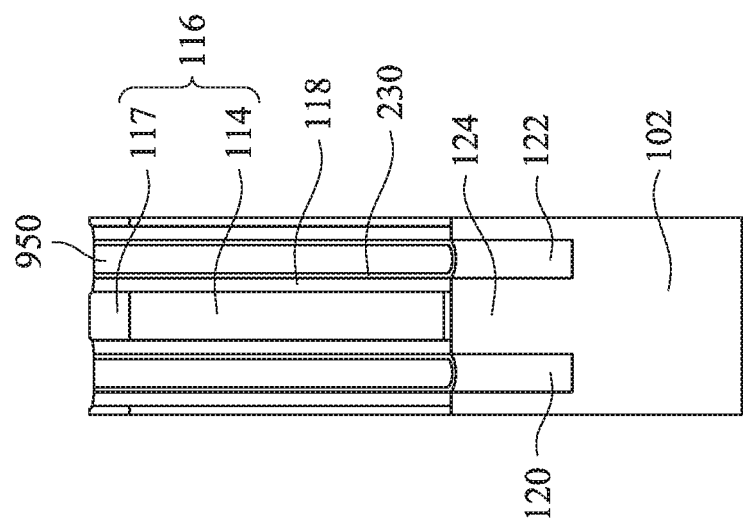
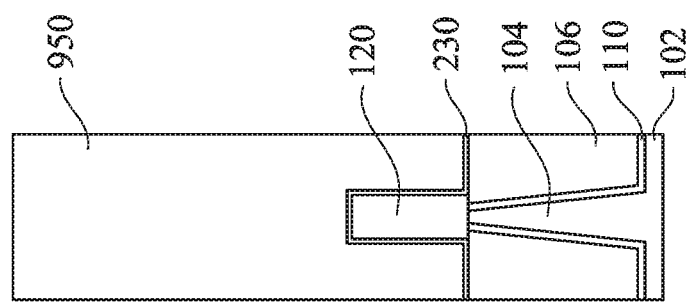
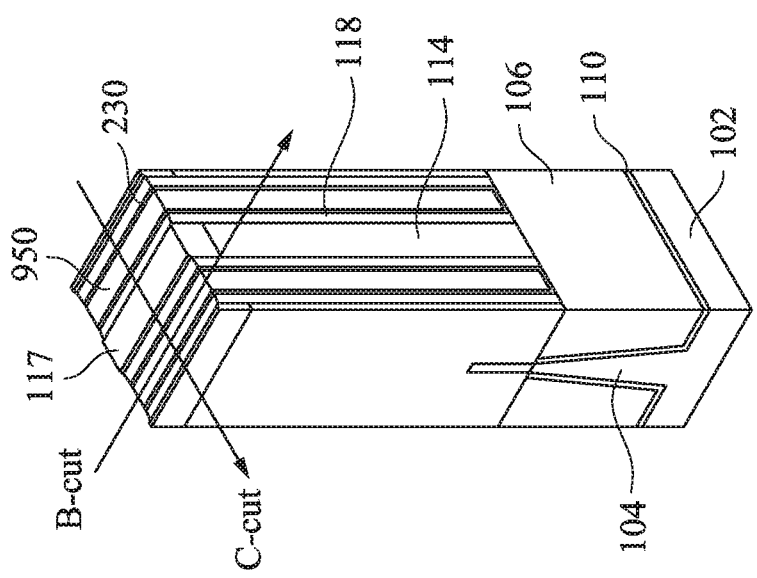
Fig. 20C
Fig. 20B
Fig. 20A

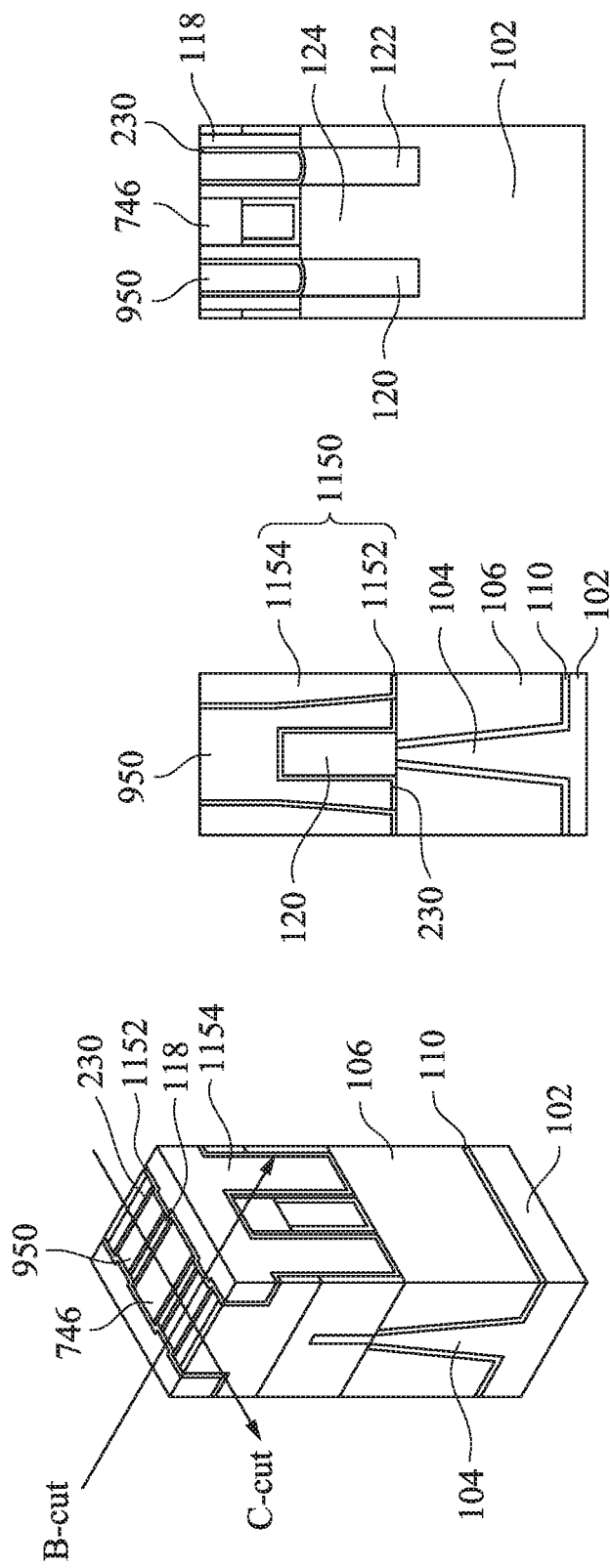

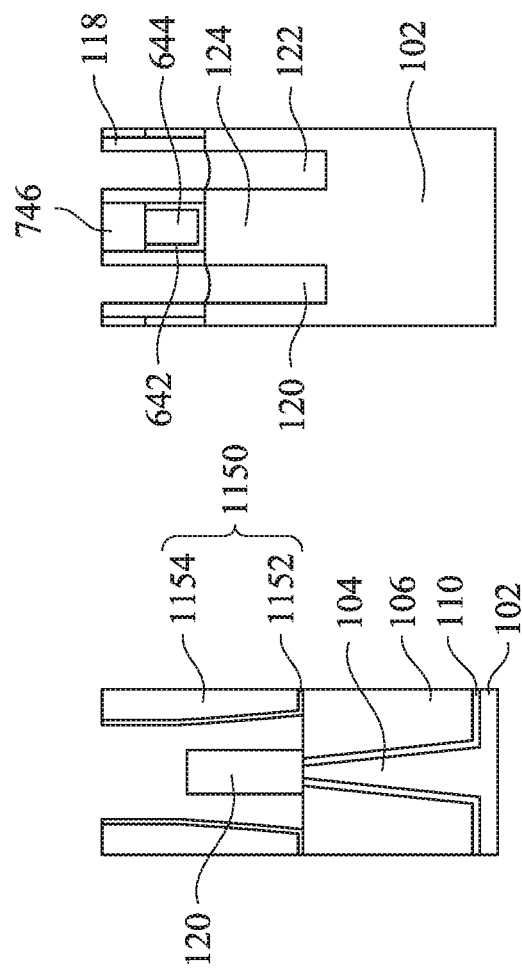
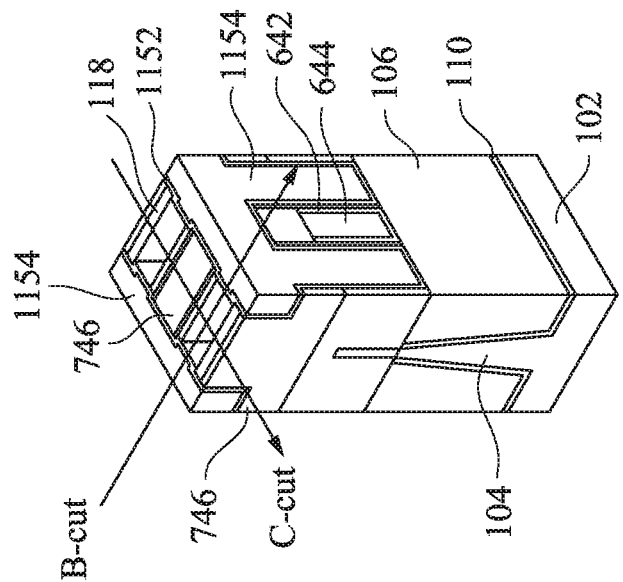
Fig. 27C
Fig. 27B
Fig. 27A

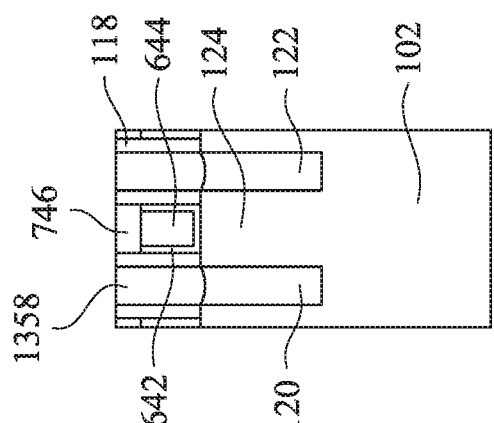
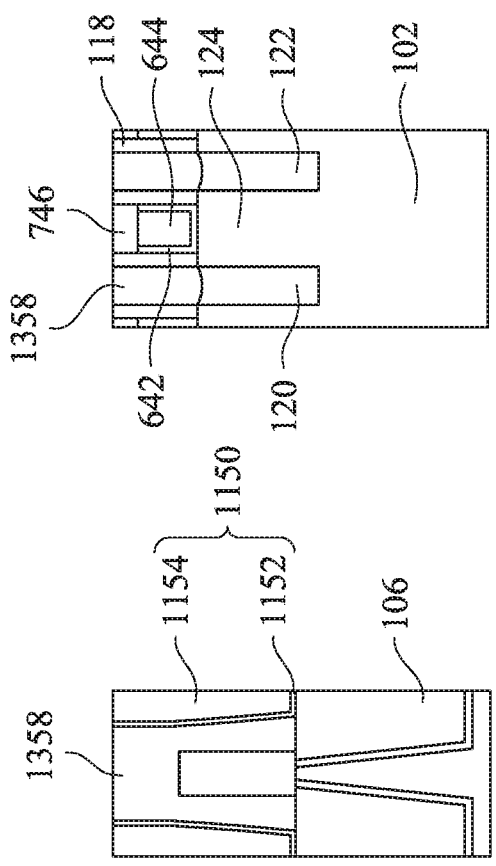
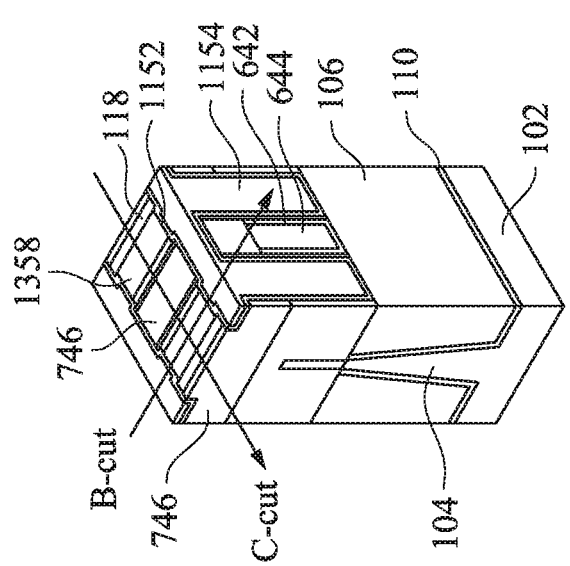
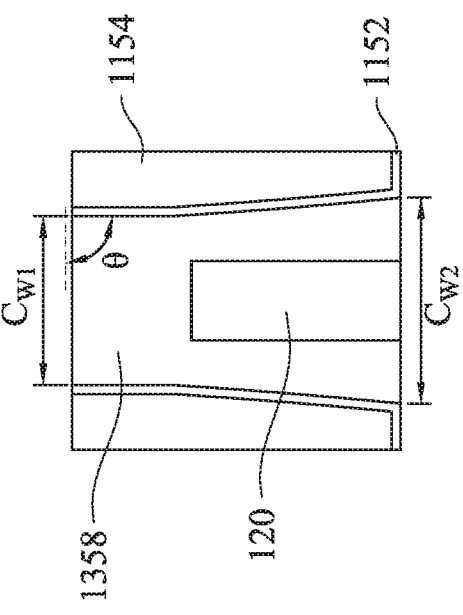
Fig. 28C
Fig. 28B
Fig. 28A
Fig. 28D

SELF-ALIGNED CONTACT AND MANUFACTURING METHOD THEREOF

This application is a divisional of U.S. application Ser. No. 15/366,956, filed Dec. 1, 2016, entitled "Self-Aligned Contact and Manufacturing Method Thereof," which claims the benefit of U.S. Provisional Patent Application Ser. No. 62/351,746, filed Jun. 17, 2016, entitled "Self Aligned Contact and Manufacturing Method Thereof," each application is incorporated herein in its entirety.

BACKGROUND

Metal-oxide-semiconductor field-effect transistors (FETs or MOSFETs) are widely used in integrated circuits (ICs). To increase the density of MOSFETs in ICs, physical dimensions such as gate length LG of MOSFETs are aggressively reduced. MOSFETs with short LG may suffer from undesirable short-channel effects (SCEs), such as high off-state leakage current and high drain-induced barrier lowering.

To suppress SCEs in transistors having short gate lengths LG, the multiple-gate field-effect transistor (MuGFET) architecture may be employed. A MuGFET has better electrostatic control of the channel potential by the gate electrode, as compared to a planar device structure. MuGFETs include examples such as the double-gate transistor and tri-gate or triple-gate transistor. A double-gate transistor is also known as a double-gate FinFET. A tri-gate transistor may be referred to as tri-gate FinFET, or simply FinFET. Double-gate or tri-gate devices employ a channel that resembles a fin. The on-state or saturation drive current IDsat flows in a fin to achieve high current density per footprint or layout area.

Other MuGFETs include pi-gate, omega-gate, surround-gate (SG) or gate-all-around (GAA) structure, where the electrostatic gate control is further improved. The SG transistor has a channel that is similar to a nanowire, where the nanowire may be oriented horizontally or vertically. For a horizontal nanowire transistor, several horizontally-oriented nanowire channels may be vertically stacked.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-13D illustrate various intermediate process steps in a fabrication process in accordance with some embodiments.

FIGS. 14A-17B illustrate various profiles that may be used in combination with other disclosed embodiments.

FIGS. 18A-28D illustrate various intermediate process steps in a fabrication process in accordance with some embodiments.

DETAILED DESCRIPTION

Figure 1C:
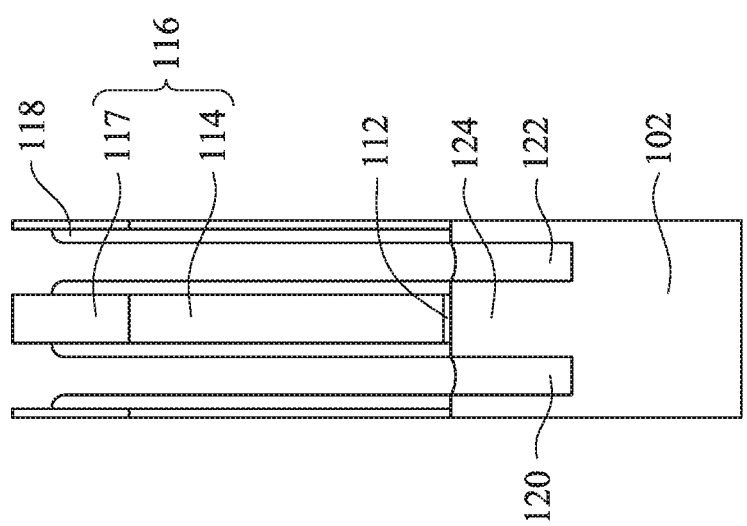

It is understood that this disclosure provides many embodiments or examples for implementing this invention. Specific examples are described below, and are not intended to be limiting. The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed embodiments relate to a method of forming a contact for multiple-gate field-effect transistors, including a method of forming self-align contacts, and reducing fringing capacitance between the gate and the contact for such devices with metal gate electrodes. The embodiments such as those disclosed herein are generally applicable to double-gate or triple-gate FinFETs, surround-gate or gate-all-around transistors and/or nanowire transistors.

As discussed in greater detail below, embodiments are disclosed that provide a process flow to integrate metal gate electrode and self-aligned contact for multiple-gate field-effect transistors or MuGFETs (double-gate, triple-gate FinFETs, and horizontal gate-all-around transistors), but may be applied to other structures as well. Disclosed embodiments may provide reduced fringing capacitance between the metal gate and the contact for multiple-gate field-effect transistors or MuGFETs (double-gate, triple-gate FinFETs, and horizontal gate-all-around transistors).

For purposes of illustration, the Figures and the following discussion refer to one fin and three gates. It is noted, however, that in other embodiments more fins may be used and fewer or greater gates may be used. Furthermore, other structures may be used. For example, epitaxial regions of adjacent fins may be joined to form a single larger source/drain region.

FIGS. 1A-13C are cross-sectional views and perspective views of intermediate stages in the manufacturing of a FinFET and the respective contacts in accordance with some embodiments. The variations of the embodiments are discussed. Throughout the various views and illustrative embodiments, like reference numbers are used to designate like elements. In FIGS. 1A-13C, the "A" figures (e.g., FIG. 1A, 2A, etc.) illustrate a perspective view, the "B" figures (e.g., FIG. 1B, 2B, etc.) illustrate a cross-sectional view along the Y-cut line illustrated in the respective "A" figure, and the "C" figures (e.g., FIG. 1C, 2C, etc.) illustrate a cross-sectional view along the X-cut line illustrated in the respective "A" figure.

Figure 1B:
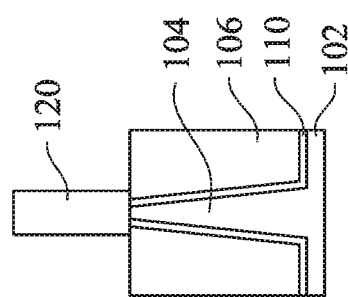
Figure 1A:
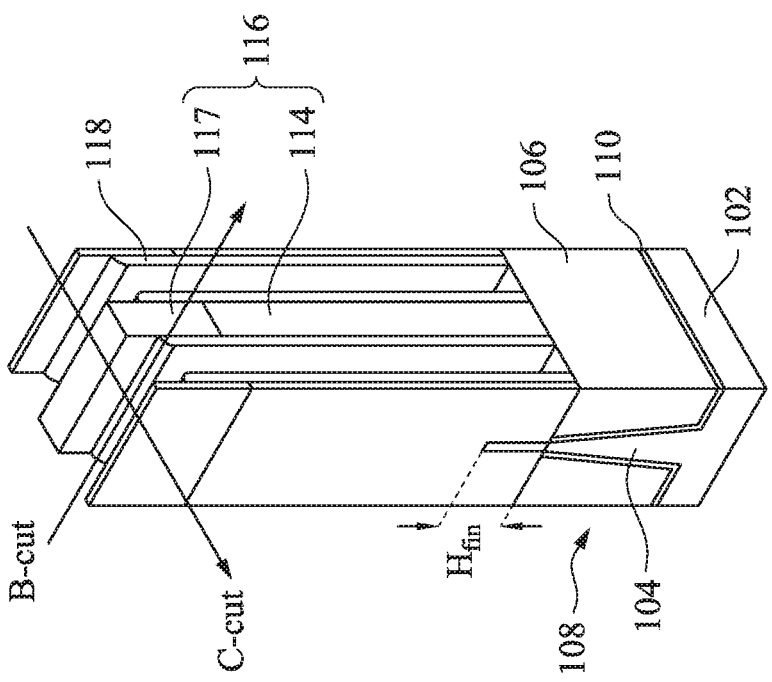

Referring first to FIGS. 1A-1C, there is shown a substrate 102 having one or more fins, with one fin 104 being illustrated. It is understood that one fin is illustrated for purposes of illustration, but other embodiments may include any number of fins. The substrate 102 may comprise various doped regions depending on design requirements (e.g., p-type substrate or n-type substrate). In some embodiments, the doped regions may be doped with p-type or n-type dopants. For example, the doped regions may be doped with p-type dopants, such as boron or BF2; n-type dopants, such as phosphorus or arsenic; and/or combinations thereof. The doped regions may be configured for an n-type FinFET, or alternatively configured for a p-type FinFET.

In some embodiments, the substrate 102 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, III-V compound semiconductors (e.g., gallium arsenide, indium gallium arsenide InmGa1-mAs, indium arsenide, indium phosphide, indium antimonide. gallium arsenic phosphide, or gallium indium phosphide), or the like. Further, the substrate 102 may include an epitaxial layer (epi-layer), may be strained for performance enhancement, and/or may include a silicon-on-insulator (SOI) structure.

The fin 104 may be formed using, for example, a patterning process to form trenches 108 such that the fin 104 is formed between adjacent fins. In some embodiments, photolithography techniques are utilized to pattern a masking layer (not shown). Generally, a photoresist material (not shown) is deposited over the masking layer. The photoresist material is irradiated (exposed) to energy, e.g. light, through a patterned reticle in order to induce a reaction in those portions of the photoresist material exposed to the energy. The photoresist material is developed to remove a portion of the photoresist material, wherein the remaining photoresist material protects the underlying material from subsequent processing steps, such as etching. As discussed in greater detail below, the fin 104 will be used to form a MuGFET. An example of the crystal orientation of a channel sidewall surface may be, for example, (110) and a channel top surface may be (001). The channel sidewall surface may be of other crystal orientations, such as (551). The channel sidewall and the channel top surface may have other crystal orientations.

Isolation regions, such as Shallow Trench Isolations (STI) 106, are formed along sidewalls of the fin 104 in the trenches 108. Prior to forming the STIs 106, one or more liners (collectively referred to as a liner 110) are formed over the substrate 102 and sidewalls of the fins 104. In some embodiments, the liner 110 has a single layer structure with a thickness between about 10 Å and about 50 Å. In other embodiments, the liner 110 has a bilayer structure comprising a first liner sub-layer and a second liner sub-layer. In some embodiments, the first liner sub-layer comprises silicon oxide and has a thickness between about 5 Å and about 20 Å, and the second liner sub-layer comprises silicon nitride and has a thickness between about 5 Å and about 30 Å. The liner 110 may be deposited through one or more processes such as physical vapor deposition (PVD), chemical vapor deposition (CVD), or atomic layer deposition (ALD), although any acceptable process may be utilized. In some embodiments, the trenches 108 have a depth from a top of the fin 104 from about 500 Å to about 3000 Å. Other materials, dimensions, and/or processes may be used.

The STIs 106 may be made of suitable dielectric materials such as silicon oxide, silicon nitride, silicon oxynitride, fluoride-doped silicate glass (FSG), low-k dielectrics such as carbon doped oxides, extremely low-k dielectrics such as porous carbon doped silicon dioxide, a polymer such as polyimide, combinations of these, or the like. In some embodiments, the STIs 106 are formed through a process such as CVD, flowable CVD (FCVD), or a spin-on-glass process, although any acceptable process may be utilized. Subsequently, portions of the STIs 106 extending over the top surfaces of the fins 104, and portions of the liner 110 over the top surfaces of the fins 104 are removed using, for example, an etch process, chemical mechanical polishing (CMP), or the like.

In some embodiments, the STI 106 and the liner 110 are recessed to expose sidewalls of the fins 104 as illustrated in FIGS. 1A-1C. In some embodiments, the STI 106 and the liner 110 are recessed using one or more selective etch processes utilizing the fins 104 as an etch mask. For example, the STI 106 and the liner 110 are recessed using a single etch processes. In alternative embodiments, the STI 106 and the liner 110 are recessed using a multiple etch processes. For example, the STI 106 is recessed using a first etch process utilizing the fins 104 and the liner 110 as an etch mask, and subsequently, the liner 110 is recessed using a second etch process. In embodiments in which the STI 106 comprise silicon oxide, the etch process may be, for example, a dry etch, a chemical etch, or a wet cleaning process. For example, the chemical etch may employ fluorine-containing chemical such as dilute hydrofluoric (dHF) acid. After the fin formation process, the fin height $H_{fin}$ may be 30 nm or higher, such as 50 nm or higher. It is understood that the fin height may be modified by subsequent processing. Other materials, processes, and dimensions may be used.

FIGS. 1A-1C further illustrate a dummy gate dielectric 112 and a dummy gate electrode 114 formed over the exposed fin 104 in accordance with some embodiments. The dummy gate dielectric 112 and the dummy gate electrode 114 will be subsequently used to define and form the source/drain regions. In some embodiments, the dummy gate dielectric 112 and the dummy gate electrode 114 are formed by depositing and patterning a dummy gate dielectric layer (not shown) formed over the exposed fins 104 and a dummy gate electrode layer (not shown) over the dummy gate dielectric layer. The dummy gate dielectric layer may be formed by thermal oxidation, CVD, sputtering, or any other methods known and used in the art for forming a dummy gate dielectric layer. In some embodiments, the dummy gate dielectric layer may be formed of a same material as the STIs 106. In other embodiments, the dummy gate dielectric 112 may be made of one or more suitable dielectric materials such as silicon oxide, silicon nitride, SiCN, SiON, $Si_3N_4$, and $SiN_xH_y$, low-k dielectrics such as carbon doped oxides, extremely low-k dielectrics such as porous carbon doped silicon dioxide, a polymer such as polyimide, the like, or a combination thereof. In some embodiments, the dummy gate dielectric layer includes dielectric materials having a high dielectric constant (k value), for example, greater than 3.9. The materials may include metal oxides such as $HfO_2$, $HfZrO_x$, $HfSiO_x$, $HfTiO_x$, $HfAlO_x$, the like, or combinations and multi-layers thereof.

Subsequently, the dummy gate electrode layer is formed over the dummy gate dielectric layer. In some embodiments, the dummy gate electrode layer is a conductive material and may be selected from a group comprising amorphous silicon, poly silicon, amorphous germanium, poly germanium, amorphous silicon-germanium, poly silicon-germanium, metallic nitrides, metallic silicides, metallic oxides, and metals. In an embodiment, the dummy gate electrode layer may be deposited by PVD, CVD, sputter deposition, or other techniques known and used in the art for depositing conductive materials. Other materials, conductive and non-conductive, may be used. The top surface of the dummy gate electrode layer usually has a non-planar top surface and may be planarized after it is deposited.

A hardmask, such as a dummy gate mask 117 formed, may be formed over the dummy gate electrode layer to aid in the patterning. The dummy gate mask 117 comprises one or more masking layers and will be used to pattern the dummy gate dielectric layer and the dummy gate electrode layer to form the dummy gate dielectric 112 and the dummy gate electrode 114 as illustrated in FIGS. 1A-1C. The dummy gate mask 117 may comprise one or more patterning layers. In some embodiments, the dummy gate mask 117 may be formed of $SiO_2$, SiCN, SiON, $Si_3N_4$, $Al_2O_3$, $SiN_xH_y$, or other suitable materials.

In some embodiments, the dummy gate mask 117 comprises a first hardmask layer and a second hardmask layer. The first hardmask layer may be an oxide layer (e.g., silicon oxide) and the second hardmask layer may be a nitride (e.g., silicon nitride). The first hardmask layer and the second hardmask layer may be deposited through a process such as CVD, or a spin-on-glass process, although any acceptable process may be utilized. The first hardmask layer may have a thickness from about 10 Å to about 250 Å and the second hardmask layer may have a thickness from about 150 Å to about 850 Å. The dummy gate electrode 114 and the dummy gate dielectric 112 collectively form a dummy gate stack 116.

Sidewall spacers 118 are formed along sidewalls of the dummy gate stack 116 in accordance with some embodiments. The sidewall spacers 118 may be formed by depositing and patterning a spacer layer (not shown) over the dummy gate stack 116, the fin 104, and the STIs 106. In some embodiments, spacer layer is formed of silicon nitride, and may have a single-layer structure. In alternative embodiments, the spacer layer may have a composite structure including a plurality of layers. For example, the spacer layer may include a silicon oxide layer and a silicon nitride layer over the silicon oxide layer. Other materials, such as $SiO_2$, SiCN, SiON, $Si_3N_4$, $SiN_xH_y$, SiOCN, other low k material, or combinations thereof, may also be used.

The spacer layer may be patterned to form sidewall spacers 118 using, for example, an anisotropic etch process to remove the spacer layer over horizontal portions of the device and along sidewalls of the dummy gate stack 116. Due to the difference in the thicknesses of the spacer layer over horizontal portions of the device and along sidewalls of the fin 104, the spacer layer remains along sidewalls of the dummy gate stacks 116 while the fins 104 are exposed in the source/drain regions as illustrated in FIGS. 1A-1C.

It is noted that the figures illustrate three gate electrodes for illustrative purposes. The gate electrode in the middle may represent an active gate electrode while the gate electrodes on either side are dummy gate electrodes (e.g., non-active) used for patterning purposes in some embodiments. In other embodiments, all of the gate electrodes may be active gate electrodes.

FIGS. 1A-1C further illustrate a first source/drain region 120 and a second source/drain region 122 formed on exposed portions of the fins 104 along opposing sides of the dummy gate stack 116 in accordance with some embodiments. In some embodiments, the fins 104 may be recessed and the first source/drain region 120 and the second source/drain region 122 are epitaxially formed on the exposed portion of the recessed fin. The use of epitaxial grown materials in the source/drain regions allows for the source/drain regions to exert stress in the channel region 124. The materials used for the first source/drain region 120 and the second source/drain region 122 may be varied for the n-type and p-type FinFETs, such that one type of material is used for the n-type FinFETs to exert a tensile stress in the channel region and another type of material for the p-type FinFETs to exert a compressive stress. For example, SiP or SiC may be used to form n-type FinFETs, and SiGe or Ge may be used to form p-type FinFETs. Other materials may be used.

In embodiments in which different materials are utilized for the n-type devices and the p-type devices, it may be desirable to mask one (e.g., the n-type fins) while forming the epitaxial material on the other (e.g., the p-type fins), and repeating the process for the other. The first source/drain regions 120 and the second source/drain regions 122 may be doped either through an implanting process to implant appropriate dopants, or by in-situ doping as the material is grown. For example, for a p-channel MuGFET where the channel may be Si or $Si_{1-x}Ge_x$, the doped epitaxial film may be boron-doped $Si_{1-y}Ge_y$, where y is equal to or larger than x to induce longitudinal compressive strain in the channel for hole mobility enhancement. For an n-channel MuGFET where the channel may be Si, the doped epitaxial film may be, for example, phosphorus-doped silicon (Si:P) or silicon-carbon ($Si_{1-z}C_z$:P). In the case where the channel is a compound semiconductor such as $In_mGa_{1-m}As$, the doped epitaxial film may be, for example, $In_nGa_{1-n}As$, where n is smaller than or equal to m.

Referring now to FIGS. 2A-2C, a liner dielectric film 230 is deposited on top of the first source/drain region 120, the second source/drain region 122, the sidewalls spacers 118, and the dummy gate stack 116. As will be described in greater detail below, a filler material will be formed over the liner dielectric film 230, which will be subsequently patterned. The liner dielectric film 230 acts as an etch stop during the patterning of the filler material. In some embodiments, the liner dielectric film 230 comprises $SiO_2$, SiCN, SiON, $Si_3N_4$, and $SiN_xH_y$, but other suitable dielectric materials may be used. The liner may further comprise a plurality of layers that comprises combinations of the above mentioned materials. The liner dielectric film 230 may be deposited through one or more processes such as PVD, CVD, or ALD, although any acceptable process may be utilized. Other materials and/or processes may be used.

In some embodiments, the liner dielectric film 230 has a thickness $t_1$ of 5 nm or less, such as 3 nm or less. Other thicknesses may be used.

Figure 3C:
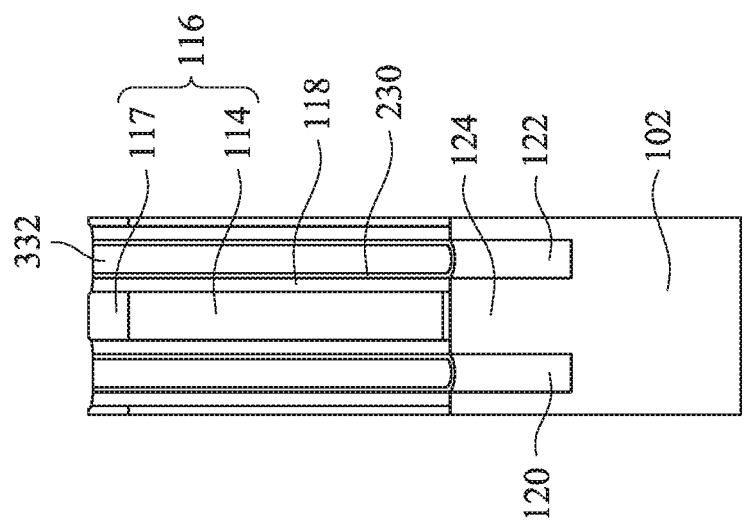
Figure 3B:
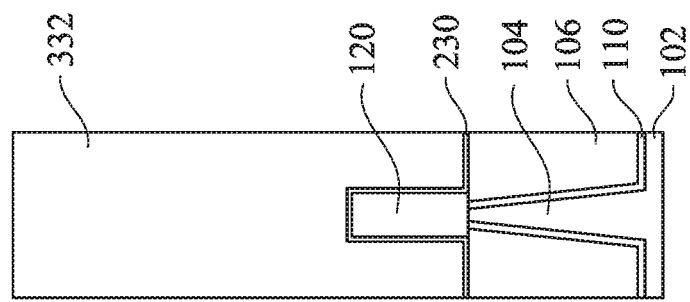
Figure 3A:
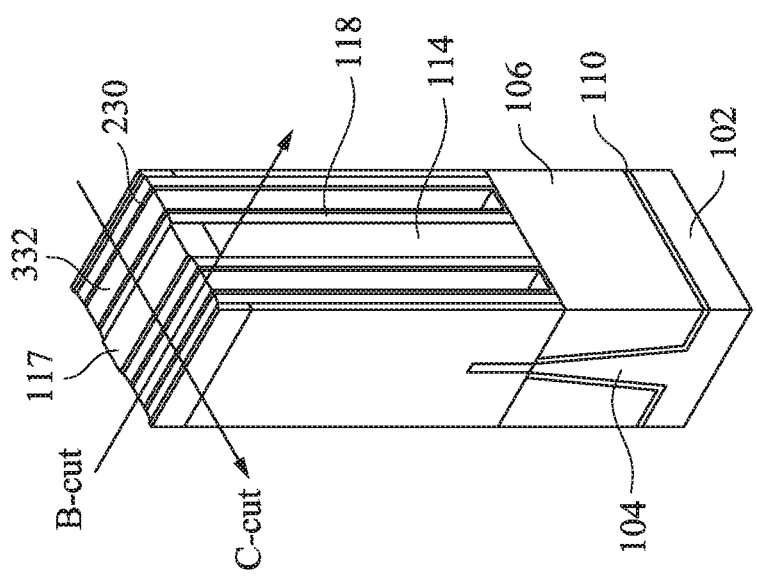

FIGS. 3A-3C illustrate formation of a sacrificial inter-gate film 332 formed over the liner dielectric film 230 in accordance with some embodiments. In some embodiments, the sacrificial inter-gate film 332 comprises Si, Ge, SiGe, $SiO_2$, SiCN, SiON, $SiO_xC_y$, $SiO_xH_y$, $SiN_xH_y$, or other suitable semiconductor or dielectric materials. In some embodiments, the sacrificial inter-gate film 332 is formed through a process such as CVD, FCVD, or a spin-on-glass process, although any acceptable process may be utilized. Subsequently, portions of the liner dielectric film 230 and the sacrificial inter-gate film 332 extending over the top of the fins 104 are removed using, for example, an etch process, CMP, or the like.

As noted above and explained in greater detail below, the sacrificial inter-gate film 332 will be subsequently removed from between the dummy gate stacks 116, and during the removal process, the underlying liner dielectric film 230 acts as an etch stop and protects the underlying structures. As such, it may be desirable to select materials for the liner dielectric film 230 and the sacrificial inter-gate film 332 having a high etch selectivity such that the etch rate for the sacrificial inter-gate film 332 is greater than the etch rate for the liner dielectric film 230 for a selected etch process.

Figure 4C:
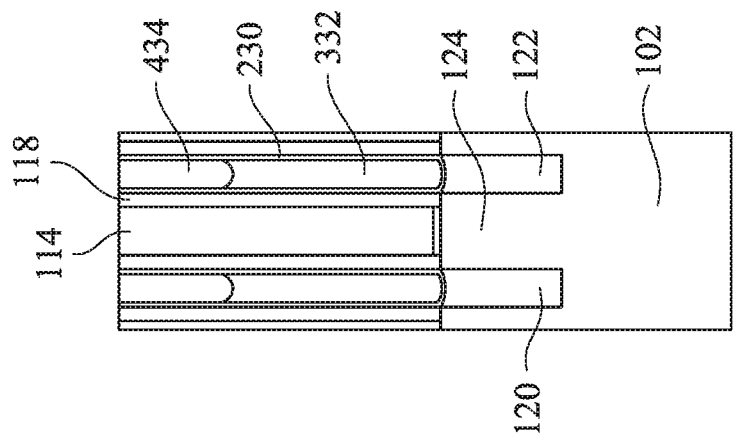
Figure 4B:
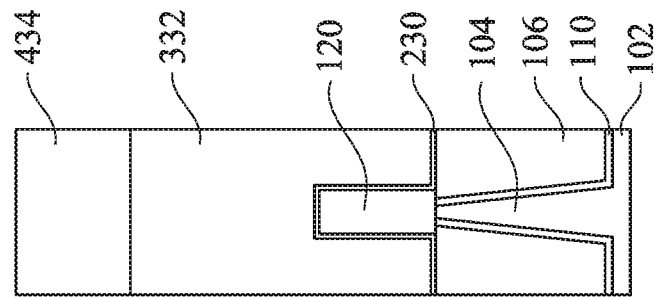
Figure 4A:
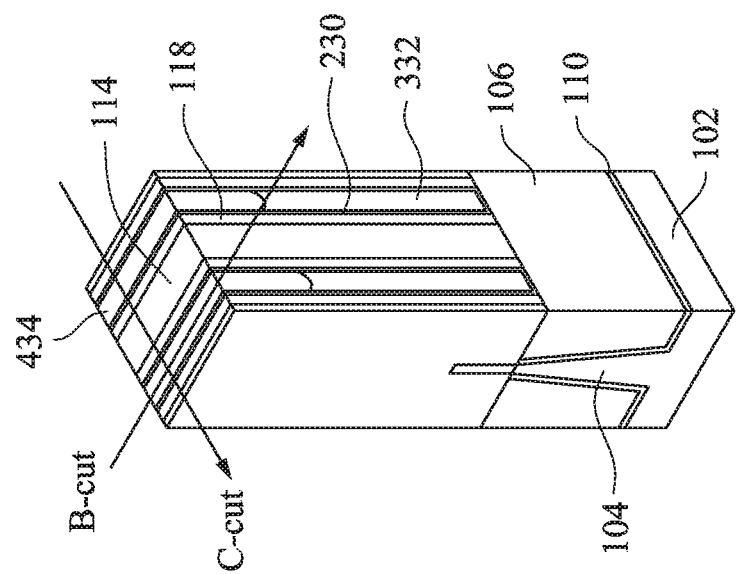

Referring now to FIGS. 4A-4C, the sacrificial inter-gate film 332 is recessed and an inter-gate mask 434 is formed in the recesses, in accordance with some embodiments. The inter-gate mask 434 prevents or reduces the loss of sacrificial inter-gate film 332 during the removal of dummy gate electrode 114 and dummy gate dielectric 112 in subsequent processes. In embodiments in which the dummy gate mask 117 comprises silicon nitride and the sacrificial inter-gate film 332 comprises silicon oxide, the sacrificial inter-gate film 332 may be recessed using an isotropic dry or wet etch process, such as wet etch using a dilute hydrofluoric acid.

In some embodiments, the inter-gate mask 434 is formed of $SiO_2$, SiCN, SiON, $Si_3N_4$, $Al_2O_3$, $La_2O_3$, $SiN_xH_y$, or the like using a CVD method, which may be Plasma Enhance CVD (PECVD), Molecular Layer Deposition (MLD), combinations thereof, or other applicable methods. A planarization process, such as a CMP process, may be performed to expose the dummy gate mask 117 (see FIGS. 3A-3C). In some embodiments, the planarization process may continue to remove the dummy gate mask 117 and to expose the dummy gate electrode 114 as illustrated in FIGS. 4A-4C.

Figure 5C:
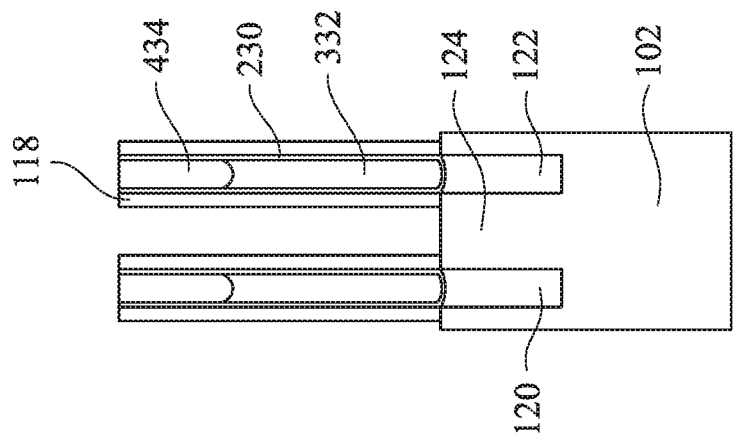
Figure 5B:
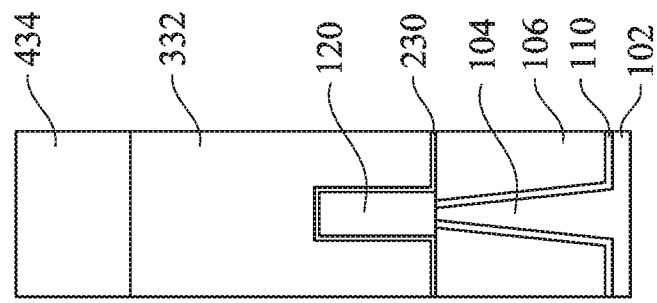
Figure 5A:
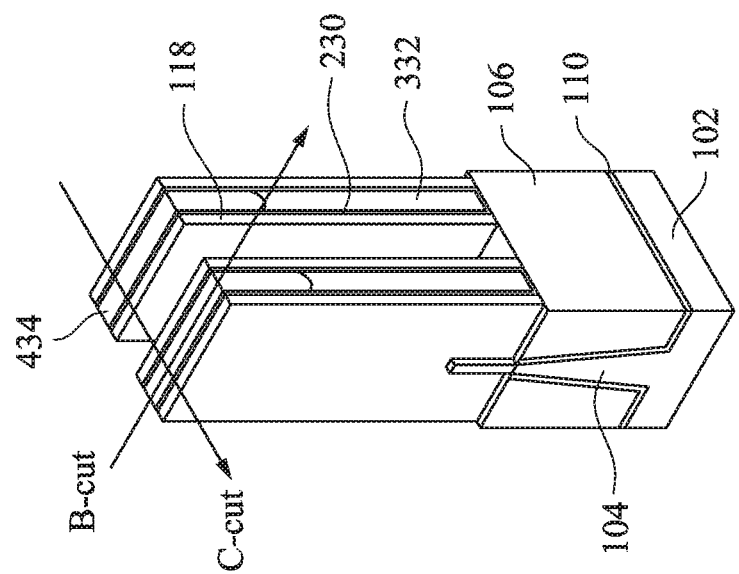

FIGS. 5A-5C illustrate removal of the dummy gate electrode 114 and the dummy gate dielectric 112 in accordance with some embodiments. With the inter-gate mask 434 protecting the sacrificial inter-gate film 332, the dummy gate stack 116 is removed. The removal process may comprise one or more etch processes. For example in embodiments in which the inter-gate mask 434 comprises silicon nitride and the dummy gate electrode 114 comprises polysilicon and the dummy gate dielectric 112 comprises silicon oxide, the removal process may comprise selectively etching using either dry or wet etching. In the case dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. In the case wet etching is used, the chemicals may include $NH_4OH:H_2O_2:H_2O$ (APM), $NH_2OH$, KOH, $HNO_3:NH_4F:H_2O$, and/or the like. The dummy gate dielectric 112 may be removed using a wet etch process, such as a diluted HF acid, may be used. Other processes and materials may be used.

Figure 6C:
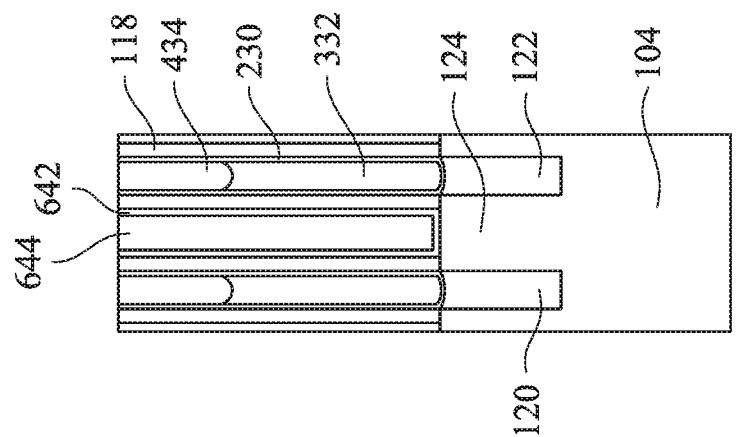
Figure 6B:
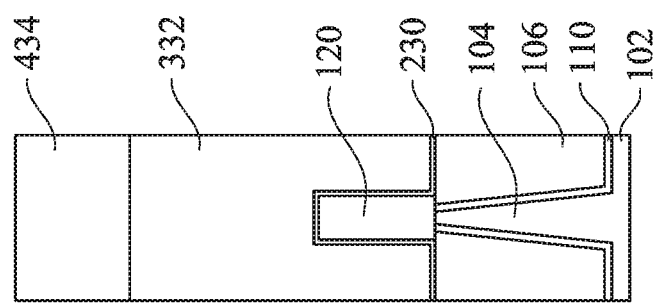
Figure 6A:
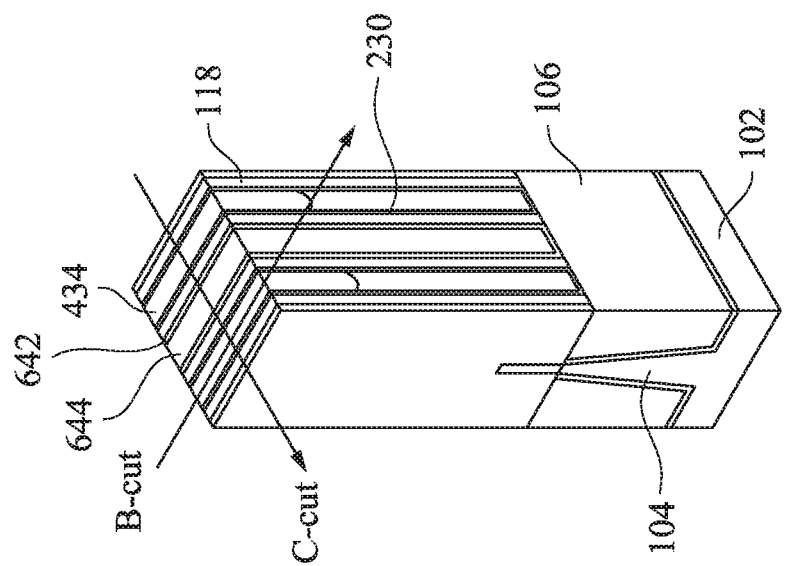

FIGS. 6A-6C illustrate formation of a gate dielectric layer 642 is formed over a channel region 124 of the fin 104 in accordance with some embodiments. In an embodiment, the gate dielectric layer 642 includes one or more high-k dielectric layers (e.g., having a dielectric constant greater than 3.9). For example, the one or more gate dielectric layers may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloyed oxides, and combinations thereof. Exemplary materials include $MgO_x$, $BaTi_xO_y$, $BaSr_xTi_yO_z$, $PbTi_xO_y$, $PbZr_xTiO_z$, SiCN, SiON, $Si_3N_4$, $Al_2O_3$, $La_2O_3$, $Ta_2O_3$, $Y_2O_3$, $HfO_2$, $ZrO_2$, HfSiON, $YGe_xO_y$, $YSi_xO_y$, and $LaAlO_3$, and the like. The formation methods of gate dielectric layer 642 include molecular-beam deposition (MBD), ALD, PVD, and the like. In an embodiment, the gate dielectric layer 642 may have a thickness of about 3 Å to about 30 Å.

In some embodiments, an interfacial layer (not shown) may be formed over the channel region 124 prior to forming the gate dielectric layer 642, and the gate dielectric layer 642 is formed over the interfacial layer. The interfacial layer helps buffer the subsequently formed high-k dielectric layer from the underlying semiconductor material. In some embodiments, the interfacial layer is a chemical silicon oxide, which may be formed of chemical reactions. For example, a chemical oxide may be formed using deionized water+ozone ($DIO_3$), $NH_4OH+H_2O_2+H_2O$ (APM), or other methods. Other embodiments may utilize a different material or processes for the interfacial layer. In an embodiment, the interfacial layer 640 may have a thickness of about 3 Å to about 7 Å.

FIGS. 6A-6C further illustrate a gate electrode 644 formed over the gate dielectric layer 642. The gate electrode 644 may be a metal selected from a group of W, Cu, Ti, Ag, Al, TiAl, TiAlN, TaC, TaCN, TaSiN, Mn, Co, Pd, Ni, Re, Jr, Ru, Pt, and Zr. In some embodiments, the gate electrode 644 comprises a metal selected from a group of TiN, WN, TaN, and Ru. Metal alloys such as Ti—Al, Ru—Ta, Ru—Zr, Pt—Ti, Co—Ni and Ni—Ta may be used and/or metal nitrides such as $WN_x$, $TiN_x$, $MoN_x$, $TaN_x$, and $TaSi_xN_y$ may be used. In some embodiments, the gate electrode 644 has a thickness in the range of about 5 nm to about 100 nm. The gate electrode 644 may be formed using a suitable process such as ALD, CVD, PVD, plating, or combinations thereof. A planarization process, such as a CMP, may be performed to remove excess materials.

Figure 7C:
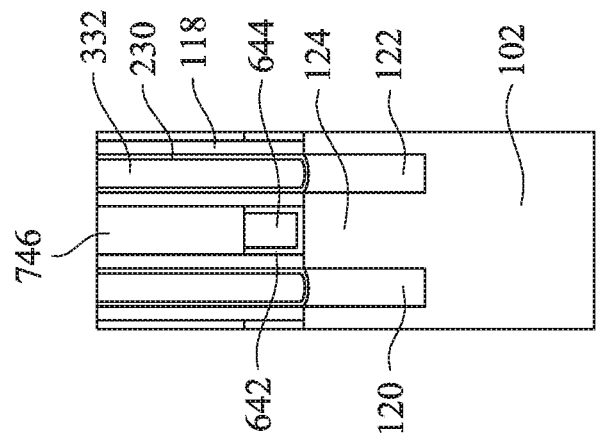
Figure 7B:
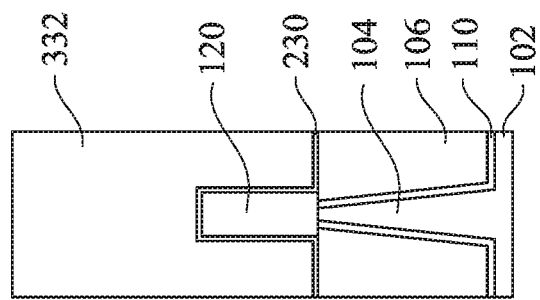
Figure 7A:
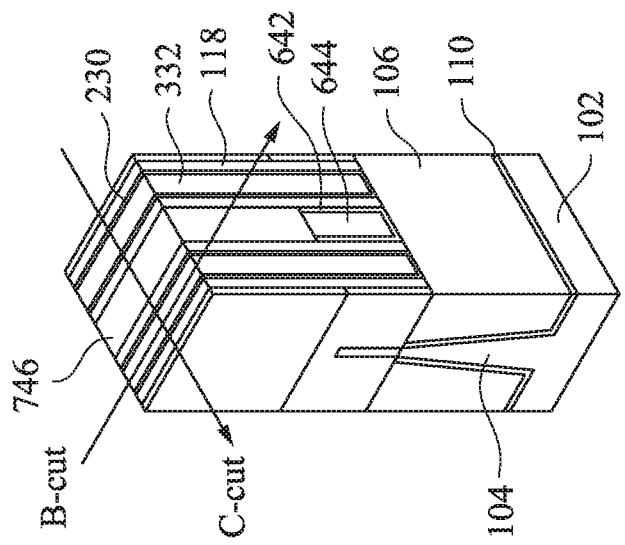

Referring now to FIGS. 7A-7C, there is illustrated the recessing of the gate electrode 644 and formation of a gate electrode mask 746 over remaining portions of the gate electrode 644 in accordance with some embodiments. In some embodiments in which the inter-gate mask 434 comprises silicon nitride, the gate electrode may be recessed using, for example, dry etch process using $Cl_2/O_2/BCl_3$, at a temperature range of 24° C. to 150° C., and at an operation pressure of below 1 torr.

After recessing the gate electrode 644, the gate electrode mask 746 may be formed in the recess to protect the gate electrode 644 during subsequent processes. In some embodiments, the gate electrode mask 746 comprises $SiO_2$, SiCN, SiON, $Si_3N_4$, $Al_2O_3$, $La_2O_3$, $SiN_xH_y$, a combination thereof, or the like, but other suitable dielectric film may be used. The gate electrode mask 746 may be formed using, for example, CVD, PVD, spin-on, or the like. Other suitable process steps may be used.

A planarization process, such as a CMP, may be performed to remove excess materials. Furthermore, the planarization process may continue to remove the inter-gate mask 434 as illustrated in FIGS. 7A-7C.

Figure 8C:
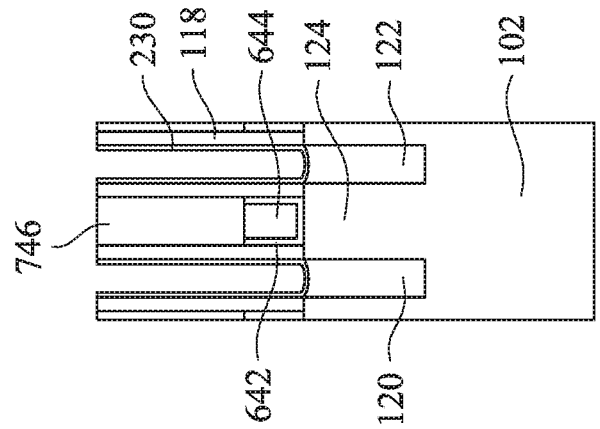
Figure 8B:
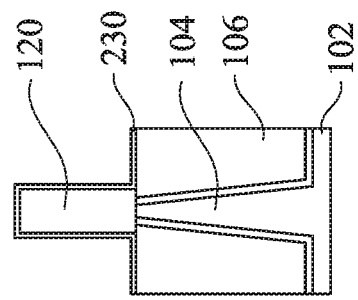
Figure 8A:
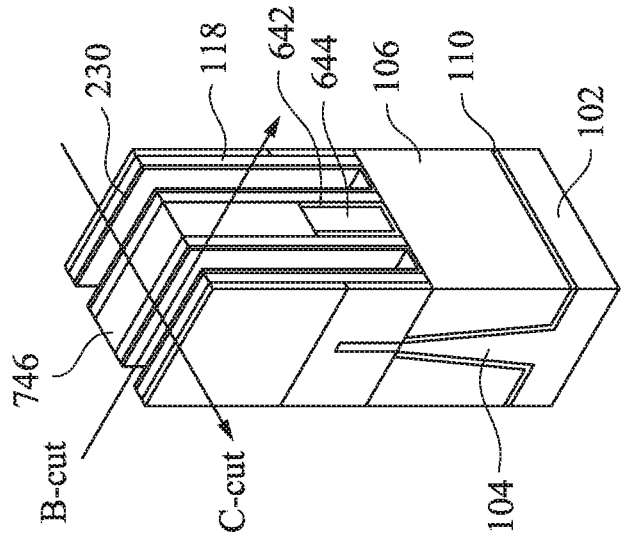

FIGS. 8A-8C illustrate removal of the sacrificial inter-gate film 332 in accordance with some embodiments. As discussed in greater detail below, the sacrificial inter-gate film 332 will be replaced with another material (e.g., the sacrificial film 950) having a higher etch rate selectivity to the materials of the other structures, such as the silicon oxide, silicon nitride, etc. of the gate electrode mask 746, the liner dielectric film 230, and the sidewall spacers 118, allowing for a more controlled contact formation.

In embodiments in which the sacrificial inter-gate film 332 is formed of silicon oxide and the gate electrode mask 746 is formed of silicon nitride, the sacrificial inter-gate film 332 may be removed using an isotropic dry or wet etch process. For example, a dry etch process using a process gas of $C_4F_6$ or fluorine-based gas, or combinations thereof, and a carrier gas such as $N_2$, $O_2$, or Ar, may be used. In the case wet etching is used, the etchants may include dilute HF, and/or the like. As illustrated in FIGS. 8A-8C, after removal of the sacrificial inter-gate film 332, the liner dielectric film 230 is exposed.

Figure 9C:
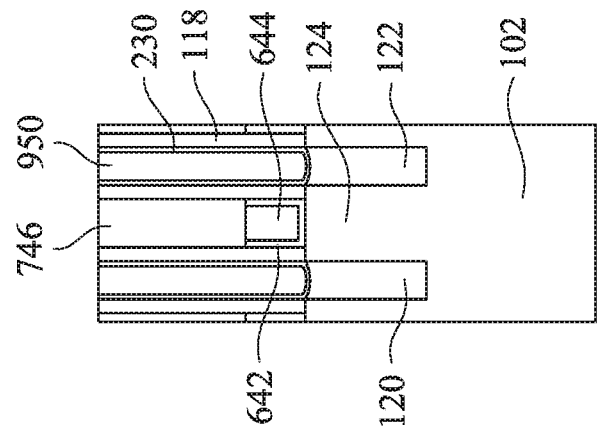
Figure 9B:
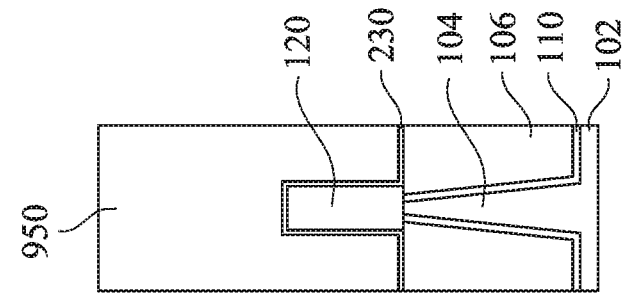
Figure 9A:
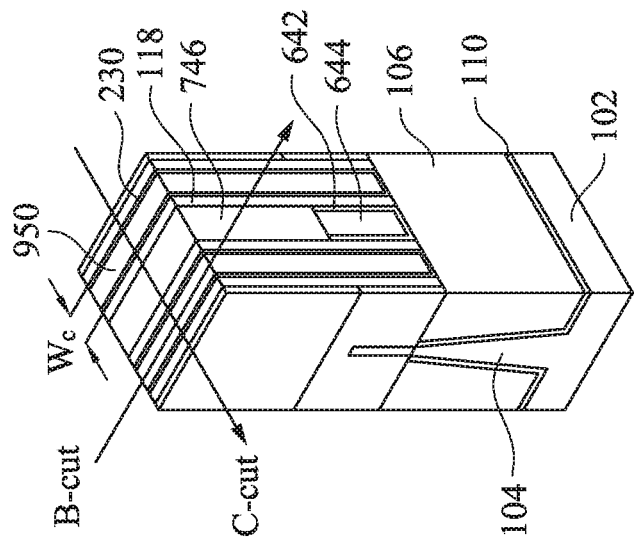

FIGS. 9A-9C illustrate formation of a sacrificial film 950 in the recesses formed by the removal of the sacrificial inter-gate film 332 (see FIGS. 8A-8C) in accordance with some embodiments. In some embodiments the sacrificial film 950 comprises polysilicon, though other materials such as $SiO_2$, SiCN, SiON, $Si_3N_4$, $SiN_xH_y$, Si, Ge, SiGe, SiGeC, GeSn or III-V materials, other suitable semiconductor or dielectric film, or the like may be used. In some embodiments, the deposition temperature of the sacrificial film 950 is kept below 600° C., such as below 500° C., or below 400° C., in order to reduce or minimize the thermal impact on the threshold voltage of the metal-gate/high-k dielectric stack previously formed. The sacrificial film 950 may also have good gap-fill capability. For example, in an embodiment, a width of the opening $w_c$ is less than 20 nm, such as less than 10 nm, or such as less than 7 nm.

For example, in some embodiments the sacrificial film 950 is Si, Ge, SiGe, SiGeC, formed by a CVD process. For example, the Si deposition process may use precursors such as silane ($SiH_4$), disilane ($Si_2H_6$), trisilane ($Si_3H_8$), tetrasilane ($Si_4H_{10}$) or other higher-order silanes. The CVD process temperature is generally dependent on the precursor used. For growth using silane or disilane, the growth temperature may be about 300° C. or higher. For growth using higher-order silanes, temperatures lower than 300° C. may be used. For the other example of Ge growth, the precursor can be germane ($GeH_4$), digermane ($Ge_2H_6$), trigermane ($Ge_3H_8$), tetragermane ($Ge_4H_{10}$), or other higher-order germanes. The growth temperature may be from about 250° C. to about 650° C. The range of operation pressure may be from 10 Torr to 760 Torr.

As explained in greater detail below, portions of the sacrificial film 950 will be selectively removed, and as such, it may be desirable to select a material for the sacrificial film 950 that has a high etch rate selectivity compared to the liner dielectric film 230, the sidewall spacers 118, and the gate electrode mask 746. For example, in embodiments in which the sacrificial film 950 is formed of polysilicon and the liner dielectric film 230, the sidewall spacers 118, and the gate electrode mask 746 are formed of silicon nitride or silicon oxide, an etching process may be used such that the sacrificial film 950 is etched at a much higher rate than the liner dielectric film 230, the sidewall spacers 118, and the gate electrode mask 746

Figure 10C:
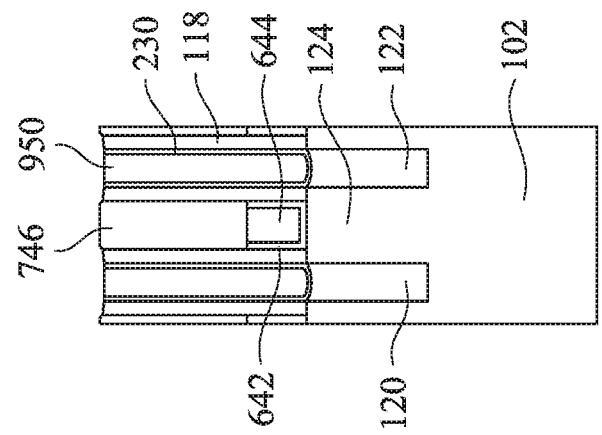
Figure 10B:
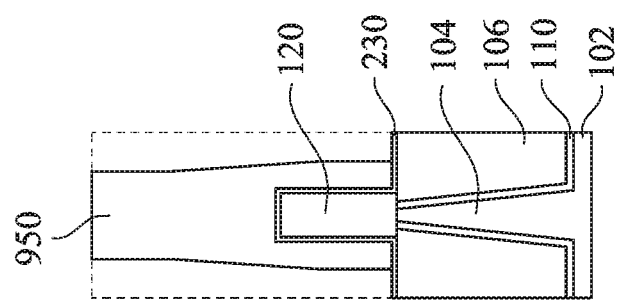
Figure 10A:
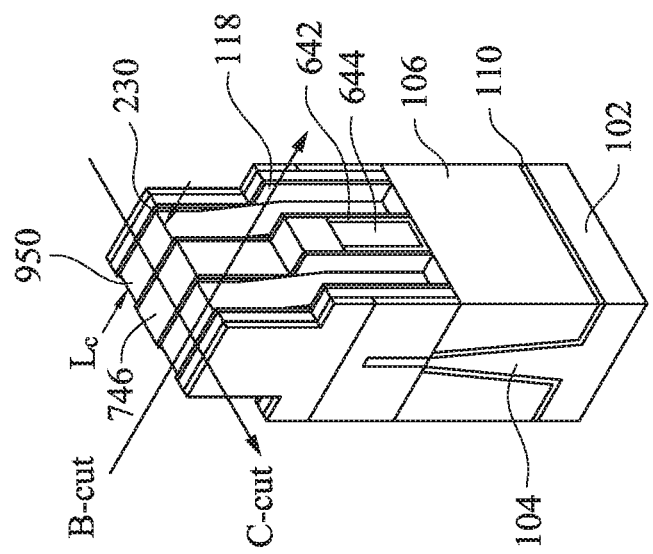

FIGS. 10A-10C illustrate the resulting structure after patterning the sacrificial film 950 in accordance with some embodiments. As will be explained below the remaining material of the sacrificial film 950 will be replaced in subsequent steps with a conductive material to form contacts to the source drain regions. In some embodiments, photolithography techniques are utilized to pattern the sacrificial film 950. Generally, a photoresist material (not shown) is deposited over the sacrificial film 950. The photoresist material is irradiated (exposed) to energy and developed such that the portions of the photoresist over regions of the sacrificial film 950 at which contacts to the source/drain regions are desired remain. The protected portions of the sacrificial film 950 represent the locations of contacts to the source/drain regions. In some embodiments, a length of the contact $l_c$ is below 40 nm, such as below 20 nm. As illustrated in FIGS. 10A-10C, portions of the liner dielectric film 230, the sidewall spacers 118, and the gate electrode mask 746 may be removed during the etch process.

The removal of the sacrificial film 950 may be done so that the etch rate of the sacrificial film is larger than the etch rate of exposed materials, e.g. liner, spacers, gate mask, and isolation dielectric film. Etch selectivities $S_l$, $S_s$, $S_{gm}$, and $S_{id}$ may be the ratios of the etch rate of the sacrificial film to that of liner dielectric film 230, the sidewall spacers 118, gate electrode mask 746, and STI 106, respectively. $S_l$, $S_s$, $S_{gm}$, and $S_{id}$ may each be higher than 3, and in some embodiments be higher than 10, such as higher than 20. During the etching of the sacrificial film 950, the liner dielectric film 230 along a top of the source/drain may be removed as the sacrificial film below the source/drain top is being etched. In some embodiments $S_1$ be at least approximately $H_{fin}/t_1$. In some embodiments, $H_{fin}$ is 60 nm and $t_1$ is 3 nm, and $S_1$ may be at least 20.

For example, in some embodiments the sacrificial film 950 is formed of polysilicon and the liner dielectric film 230, sidewall spacers 118, and the gate electrode mask 746 are formed of silicon nitride. In such an embodiment, a contact isolation etch process using dry etching may be used to avoid laterally overetching that may be exhibited by some wet etch behavior. The process gas may include $HBr/N_2/O_2$, or $Cl_2/SF_6$ at a temperature of less than 200° C. (e.g., less than 100° C.), an RF power of less than 3 kW (e.g., less than 600 W), and at a pressure of less than 10 torr (e.g., less than 3 torr).

As another example, in some embodiments the sacrificial film 950 is formed of SiOC formed by spin-on coating, and the liner dielectric film 230, sidewall spacers 118, and the gate electrode mask 746 are formed of silicon nitride. In these embodiments, an anisotropic etch process may be used to remove this sacrificial film 950 in the contact isolation regions. The process gas may include $N_2$ and $H_2$, or $SO_2$ and $O_2$, at a temperature of less than 200° C. (e.g., 20-100° C.), an RF power of greater than 100 W (e.g., greater than 300 W), and at a pressure of less than 3 torr (e.g., less than 200 mtorr).

As yet another example, in some embodiments the sacrificial film 950 is formed of silicon oxide formed by flowable CVD, and the liner dielectric film 230, sidewall spacers 118, and the gate electrode mask 746 are formed of silicon nitride. The removal of the sacrificial film 950 may be performed using a plasma etch process the process gas may include $C_4F_6$ or a fluorine-based gas, at a temperature of less than 200° C. (e.g., less than 150° C.), an RF power of greater than 50 W (e.g., greater than 100 W), and at a pressure of less than 3 torr (e.g., less than 200 mtorr).

As yet another example, in some embodiments the sacrificial film 950 is formed of germanium, and the liner dielectric film 230, sidewall spacers 118, and the gate electrode mask 746 are formed of silicon nitride. In these embodiments, a plasma etch process may be used to remove 950 by anisotropic etch. The process gas may include $CF_4$ chemistry (e.g., $CF_2Cl_2$, $CF_3Br$, or the like, or HBr, $Cl_2$ or other halogen gases, at a temperature of less than 200° C. (e.g., less than 60° C.), an RF power of greater than 2,000 kW (e.g., from about 50 W to about 300 W), and at a pressure of less than 10 torr (e.g., less than 500 mtorr).

Figures 11A, 11B, 11C:
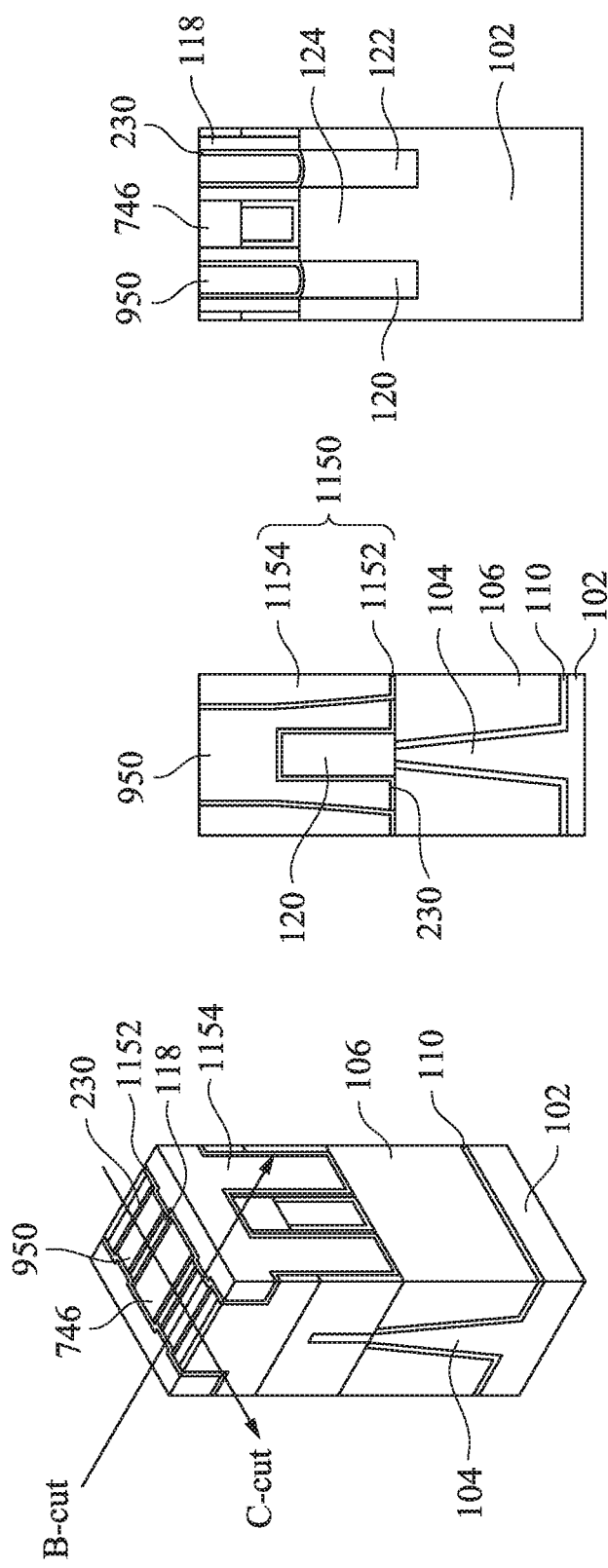

Referring now to FIGS. 11A-11C, an interlayer dielectric (ILD) 1150 is formed in accordance with an embodiment. The ILD 1150 may comprise a single layer or multiple layers. For example, in some embodiments an ILD liner 1152 is deposited on top of the first source/drain region 120, the second source/drain region 122, the sidewalls spacers 118, and the dummy gate stack 116, and an ILD filler material 1154 is deposited over the ILD liner 1152. (The ILD liner 1152 and the ILD filler material 1154 are collectively referred to as the ILD 1150.) In some embodiments, the ILD liner 1152 comprises $SiO_2$, SiCN, SiON, $Si_3N_4$, and $SiN_xH_y$, but other suitable dielectric materials may be used. The ILD liner 1152 may further comprise a plurality of layers that comprise combinations of the above mentioned materials. The ILD liner 1152 may be deposited through one or more processes such as PVD, CVD, or ALD, although any acceptable process may be utilized. Other materials and/or processes may be used.

In some embodiments, the ILD filler material 1154 comprises $SiO_2$, SiCN, SiOC, SiON, $Si_3N_4$, and $SiN_xH_y$, but other suitable dielectric film may be used. The isolation dielectric may be cured or treated after deposition. For example, the curing may involve irradiation with ultra-violet radiation, and the treatment may involve annealing in $N_2$, $O_2$, or $H_2O$ ambient at temperatures ranging above 200° C. After the curing or treatment, the isolation dielectric may have a relative permittivity of less than 6, such as less than 5, and such as less than 4. For example, the isolation dielectric may be $SiO_2$ formed by CVD, PECVD or ALD deposition process, FCVD, or a spin-on-glass process. A planarization process, such as a CMP process, may be performed to remove excess materials and to expose the sacrificial film 950.

FIGS. 12A-12C illustrate the removal of the sacrificial film 950 (see FIGS. 11A-11C) in accordance with some embodiments. As discussed in greater detail below, the sacrificial film 950 is replaced with a conductive material which will form the contacts to the source/drain regions. In some embodiments, the sacrificial film 950 may be removed using a selective etch process. As such, it may be desirable to select materials for the sacrificial film 950, the ILD 1150, the liner dielectric film 230, the sidewall spacers 118, and the gate electrode mask 746 such that a high etch rate selectivity exists between the material of the sacrificial film 950 and the materials of the ILD 1150, the liner dielectric film 230, the sidewall spacers 118, and the gate electrode mask 746.

For example, in some embodiments the sacrificial film 950 is formed of polysilicon and the ILD liner 1152, the ILD filler material 1154, the liner dielectric film 230, the sidewall spacers 118, and the gate electrode mask 746 is formed of silicon nitride and/or silicon oxide. In these embodiments, a ratio of an etch rate of the polysilicon to an etch rate of the silicon nitride and the silicon oxide may be about 30 to about 50 using an isotropic etch process. In the case plasma etching is used, the process gas may include $Cl_2/NF_3$/He or SF6 or NF3 or CF4 or other suitable halogens based etch gas at a temperature of less than 200° C. (e.g., less than 100° C.), an RF power of less than 3 kW (e.g., less than 600 W), and at a pressure of less than 10 torr (e.g., less than 3 torr). In some embodiments, the wet etch process is used to remove the sacrificial film 950. The etch material of wet etch process can be $NH_4OH$ or TMAH or other material can remove Si film. As another example, a dry chemical etch process may be performed using fluorine-based gas/$NH_3$ at a temperature of less than 200° C. (e.g., less than 100° C.).

As another example, in some embodiments the sacrificial film 950 is formed of SiOC formed by spin-on coating, the ILD filler material 1154 is $SiO_2$ formed by flowable CVD, the ILD liner 1152 may be an ALD silicon nitride, and the gate electrode mask 746 may be silicon nitride. In these embodiments, a ratio of an etch rate of the SiOC to an etch rate of the silicon nitride and the silicon oxide may be greater than 50 using a plasma etch process wherein the process gas may include $N_2$ and $H_2$, or $SO_2$ and $O_2$, at a temperature of less than 200° C. (e.g., 20-100° C.), an RF power of greater than 100 W (e.g., greater than 300 W), and at a pressure of less than 3 torr (e.g., less than 200 mtorr).

As yet another example, in some embodiments the sacrificial film 950 is formed of silicon oxide formed by flowable CVD, the ILD filler material 1154 is $SiO_2$ formed by flowable CVD, the ILD liner 1152 may be an silicon nitride, and the gate electrode mask 746 may be silicon nitride. The removal of the sacrificial film 950 may be performed using a plasma etch process the process gas may include $C_4F_6$ or a fluorine-based gas, at a temperature of less than 200° C. (e.g., less than 150° C.), an RF power of greater than 50 W (e.g., greater than 100 W), and at a pressure of less than 3 torr (e.g., less than 200 mtorr).

As yet another example, in some embodiments the sacrificial film 950 is formed of germanium, the ILD filler material 1154 is $SiO_2$, the ILD liner 1152 may be an ALD silicon nitride, and the gate electrode mask 746 may be silicon nitride. In these embodiments, a ratio of an etch rate of the germanium to an etch rate of the silicon nitride and the silicon oxide may be greater than 15 using a plasma etch process wherein the process gas may include $CF_4$ chemistry (e.g., $CF_2Cl_2$, $CF_3Br$, or the like, or HBr, $Cl_2$ or other halogen gases, at a temperature of less than 200° C. (e.g., less than 60° C.), an RF power of greater than 2,000 kW (e.g., from about 50 W to about 300 W), and at a pressure of less than 10 torr (e.g., less than 500 mtorr).

After removing the sacrificial film 950, exposed portions of the liner dielectric film 230 may be removed to expose the underlying first source/drain region 120 and the second source/drain region 122. In embodiments in which the liner dielectric film 230 is formed of silicon nitride, the ILD liner 1152 is formed of silicon nitride and the ILD filler material 1154 is formed of silicon oxide, the liner dielectric film 230 may be removed using a dry etch process with a fluorine-based etching gas. Due to the difference in materials, the liner dielectric film 230 may be removed without removing or limiting the removal of the ILD liner 1152 and the ILD filler material 1154.

As illustrated above, the use of the sacrificial film 950, and the selection of a material capable of being selectively etched with a high-etch rate selectivity as compared to other materials, contact openings may be formed using a self-aligned process. As such, embodiments such as those disclosed herein allow formation of smaller contact areas as devices are scaled down further to meet market demands with less risk of mis-alignment, which may cause shorting and device failure issues. Additionally, the full space between the sidewall spacers can be used thereby allowing for larger contact areas, which may lower contact resistance and provide increased device performance.

Referring now to FIGS. 13A-13D, there is shown formation of contacts 1358 in accordance with some embodiments, wherein FIG. 13 D illustrates an enlarged view of a portion of FIG. 13B. The contacts 1358 may comprise a single layer or a multi-layer structure. For example, in some embodiments the contacts 1358 comprise a liner, such as a diffusion barrier layer, an adhesion layer, or the like, and a contact filler formed over the contact liner in the openings. The contact liner may include Ti, TiN, Ta, TaN, or the like formed by ALD, CVD, or the like. The contact filler may be formed by depositing a conductive material, such as one or more layers of Ni, Ta, TaN, W, Co, Ti, TiN, Al, Cu, Au, alloys thereof, combinations thereof, or the like, but other suitable metal may be used. A planarization process, such as a CMP, may be performed to remove excess material from a surface of the ILD filler material 1154.

As illustrated in FIG. 13D, the contacts 1358 may exhibit a tapered contact sidewall profile and the angle between the top contact plane and contact sidewall is larger than 90°. As illustrated in FIG. 13D, a width of the contacts 1358 along a top of the contacts 1358 $C_{w1}$ is less than a width of the contacts 1358 along a bottom of the contacts 1358 $C_{w2}$.

Figure 14B:
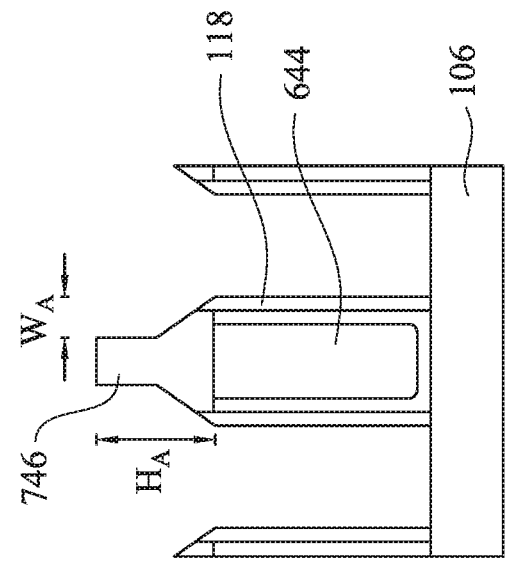
Figure 14A:
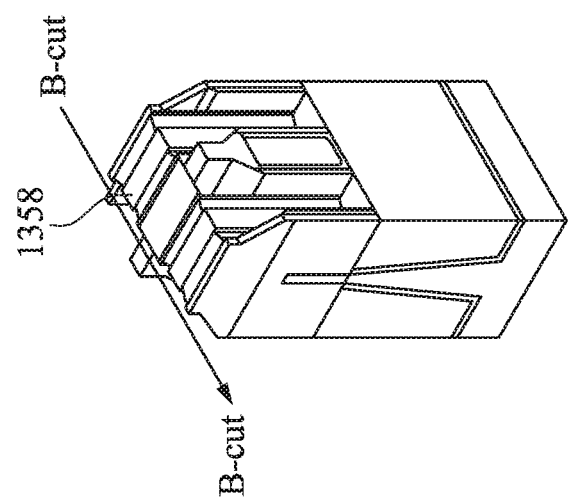

FIGS. 14A-15B illustrate different etch profiles that may be obtained in a contact isolation region during removal of the sacrificial film 950 in accordance with some embodiments. The process illustrated in FIGS. 14A-15B assume processes discussed above with reference to FIGS. 1A-10C are performed prior, and processes discussed above with reference to FIGS. 11A-13 are performed after the processes discussed below with reference to FIGS. 14A-15B. Accordingly, after performing processes discussed above with reference to FIGS. 1A-10C, an additional etch process may be performed to laterally widen an upper portion of the opening above the contact isolation region while portions of the sacrificial film 950 over the source/drain regions are protected as discussed above with reference to FIGS. 10A-10C. As illustrated in FIG. 14A-14B, the second etch may laterally remove upper portions of the sidewall spacers 118 and portions of the remaining gate electrode mask 746, thereby creating a funnel-shaped opening profile. The funnel-shaped opening profile allows part of the sidewall spacers 118 and the gate electrode mask 746 to be replaced with a lower dielectric constant material, thereby reducing the fringing capacitance between the gate electrode 644 and the contact 1358 and improving device performance.

In some embodiments in which the sidewall spacers 118 and the gate electrode mask 746 are formed of silicon nitride, a lateral dry etch plasma process using a process gas of $CF_4$ chemistry (e.g., $CF_2Cl_2$, $CF_3Br$, or the like), at a temperature of less than 250° C. (e.g., less than 150° C.), an RF power of greater than 3 kW (e.g., less than 2 kW), and at a pressure of less than 5 torr (e.g., less than 2.5 torr) may be performed. In some embodiments, the height ($H_A$) and width ($W_A$) are greater than 4 nm and greater than 2 nm, respectively.

Thereafter, processes such as those discussed above with reference to FIGS. 11A-11C may be performed to fill the funnel-shaped opening with the ILD material (e.g., the ILD liner 1152 and the ILD filler material 1154), thereby resulting in the structure illustrated in FIGS. 15A-15B. Processes such as those discussed above with reference to FIGS. 11A-13D may be performed to complete formation of the contacts.

FIGS. 16A-17B illustrate different etch profiles that may be obtained in the contact regions during removal of the sacrificial film 950 in the contact regions in accordance with some embodiments. As discussed above, FIGS. 14A-15B illustrate different profiles that may be obtained for the openings in which the ILD 1150 is formed. FIGS. 16A-17B illustrates that similar etch profiles may be used for forming the openings in which the contacts 1358 will be formed.

Figure 16B:
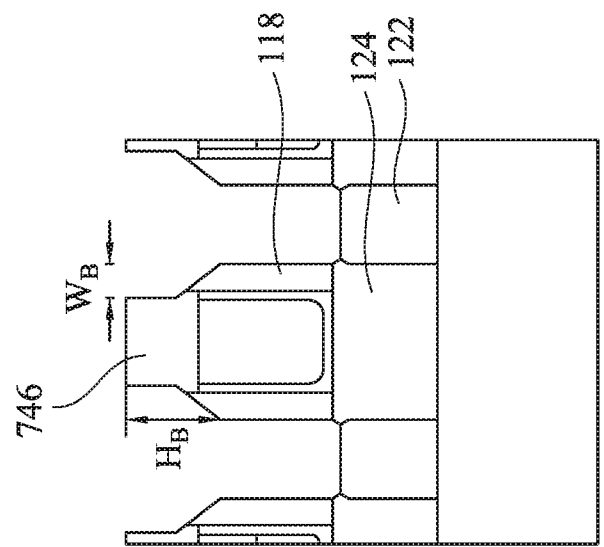
Figure 16A:
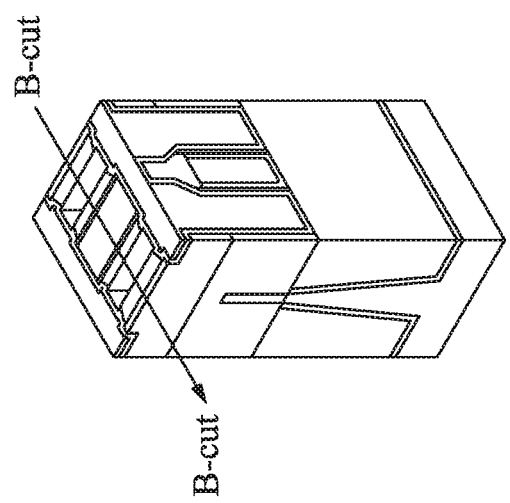

The processes illustrated in FIGS. 16A-17B assume processes discussed above with reference to FIGS. 1A-1C through the process of removing the sacrificial film 950 as discussed in reference to FIGS. 12A-12C, are performed prior to the processes illustrated in FIGS. 16A-17B, wherein an additional etch process may be performed to laterally widen an upper portion of the opening above the contact region of the source/drain regions. As illustrated in FIG. 16A-16B, the second etch may laterally remove upper portions of sidewall spacers 118 and portions of the gate electrode mask 746, thereby creating a funnel-shaped opening profile as shown in FIGS. 16A-16B. The ILD liner 1152 may be removed from over the source/drain regions as discussed above with reference to FIGS. 12-12C.

Figure 17B:
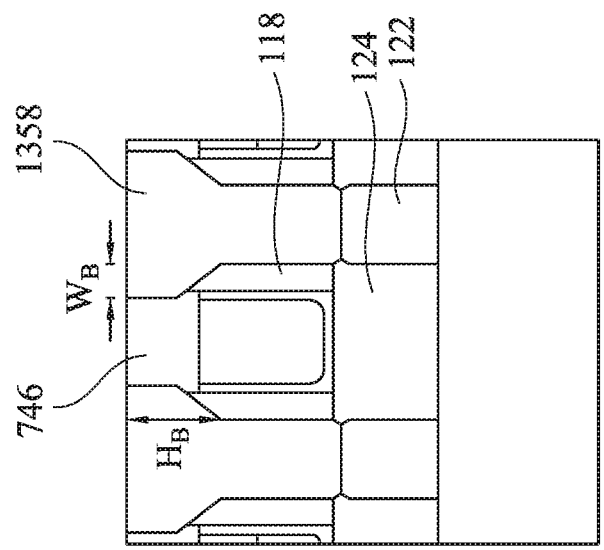
Figure 17A:
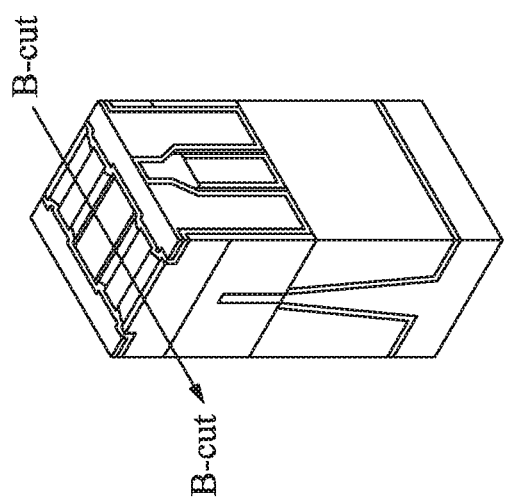
Figure 18C:
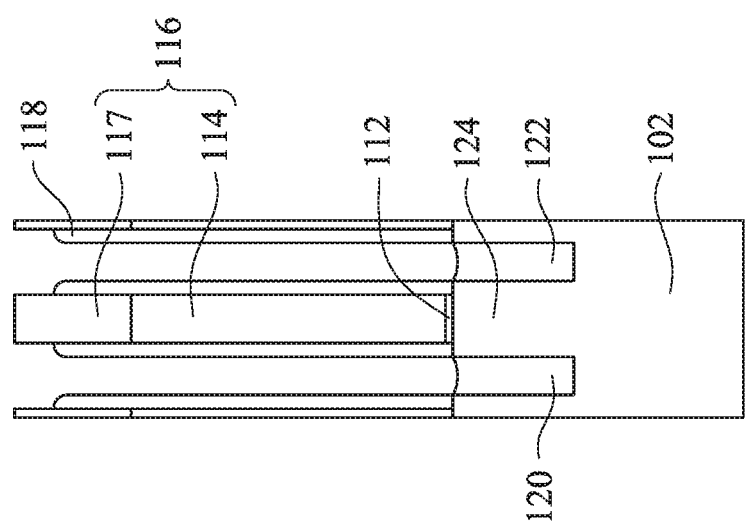
Figure 18B:
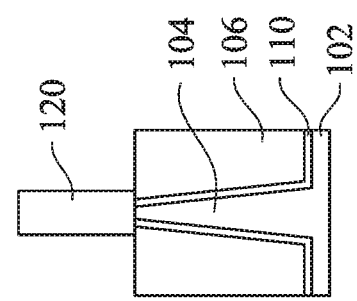
Figure 18A:
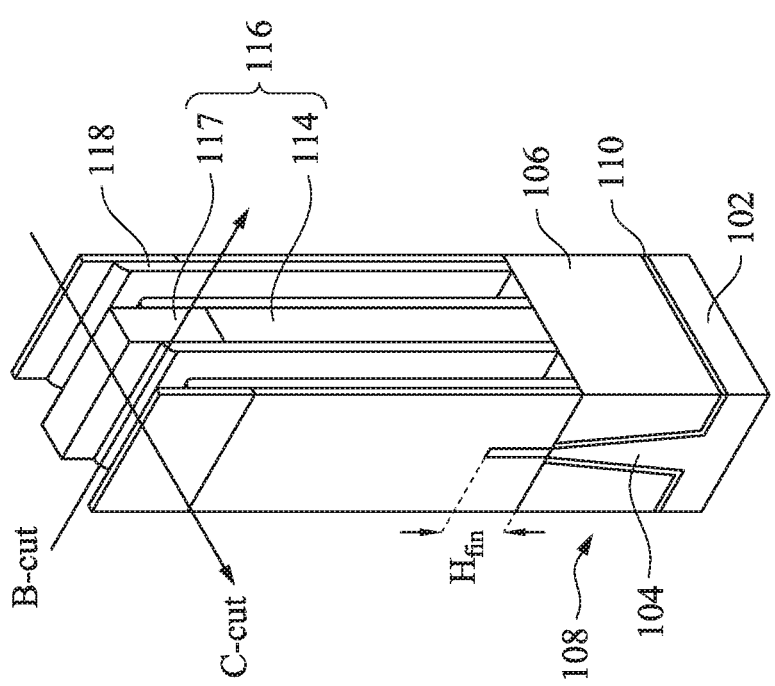

In some embodiments in which the ILD liner 1152 and the gate electrode mask 746 are formed of silicon nitride, a lateral dry etch plasma process using a process gas of $CF_4$ chemistry (e.g., $CF_2Cl_2$, $CF_3Br$, or the like), at a temperature of less than 250° C. (e.g., less than 150° C.), an RF power of greater than 3 kW (e.g., less than 2 kW), and at a pressure of less than 5 torr (e.g., less than 2.5 torr) may be used. In some embodiments, the height ($H_B$) and width ($W_B$) may be less than 7 nm and less than 3 nm, respectively. In some embodiments, $H_B$ and $W_B$ may be greater than $H_A$ and $W_A$ respectively. The funnel-shaped opening may then be filled with a conductive material as discussed above with reference to FIGS. 13A-13D, thereby resulting in a contact as illustrated in FIGS. 17A-17B.

Other processes may be performed. For example, in some embodiments a metal silicide may be formed over the first source/drain regions 930 and the second source/drain regions 932. In some embodiments a metal silicide formation process is performed after the inter-gate film film removal process discussed above with reference to FIGS. 8A-8C, or after the contact hole formation discussed above with reference to FIGS. 12A-12C. The metal silicide formation process may form a metal silicide on top of the doped source/drain region to reduce $R_c$ between the doped source/drain regions and the contact metal formed thereafter. The metal silicide formation process includes a metal film deposition on top of the source/drain region, a thermal treatment to form a metal silicide at the interface between the source/drain region and an etching process to remove the excess unreacted metal. The metal silicide comprises $TiSi_x$, $NiSi_x$, $CoSi_x$, $NiCoSi_x$, and $TaSi_x$, but other suitable silicide materials may be used. In some embodiments, the silicide formation may be performed ILD removal.

It is noted that other embodiments may utilize various other steps or ordering of the steps. For example, FIGS. 18-28 illustrate various cross-sectional views and perspective views of intermediate stages in the manufacturing of a FinFET in accordance with some embodiments. In FIGS. 18A-28C, the "A" figures (e.g., FIG. 18A, 19A, etc.) illustrate a perspective view, the "B" figures (e.g., FIG. 18B, 19B, etc.) illustrate a cross-sectional view along the Y-cut line illustrated in the respective "A" figure, and the "C" figures (e.g., FIG. 18C, 19C, etc.) illustrate a cross-sectional view along the X-cut line illustrated in the respective "A" figure.

As discussed above with reference to FIGS. 1-15, a sacrificial inter-gate film film 332 was temporarily deposited as illustrated in FIGS. 3A-3C, and then removed as illustrated in FIGS. 8A-8C and replaced with a sacrificial film 950 as illustrated in FIGS. 9A-9C. In the embodiments illustrated in FIGS. 18-28, the sacrificial inter-gate 332 is omitted. Rather, as discussed in greater detail below, the sacrificial film 950 is formed earlier in the process. Greater detail of the process is discussed in the following paragraphs with reference to FIGS. 18-28, wherein like reference numerals refer to like elements.

Referring first to FIGS. 18A-19C, processes and materials similar to those discussed above with reference to FIGS. 1A-2C are illustrated, wherein like reference numerals refer to like elements, and will not be repeated.

Referring now to FIGS. 20A-20C, the sacrificial film 950 is formed, using for example, materials and processes similar to those discussed above with reference to FIGS. 9A-9C.

Figure 21C:
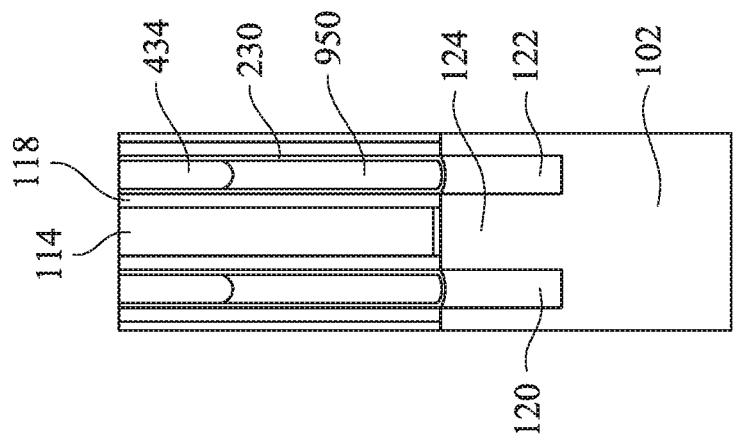
Figure 21B:
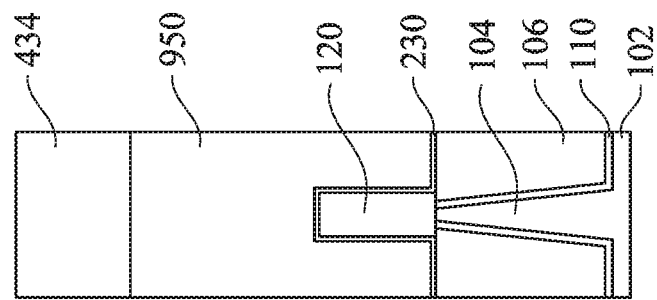
Figure 21A:
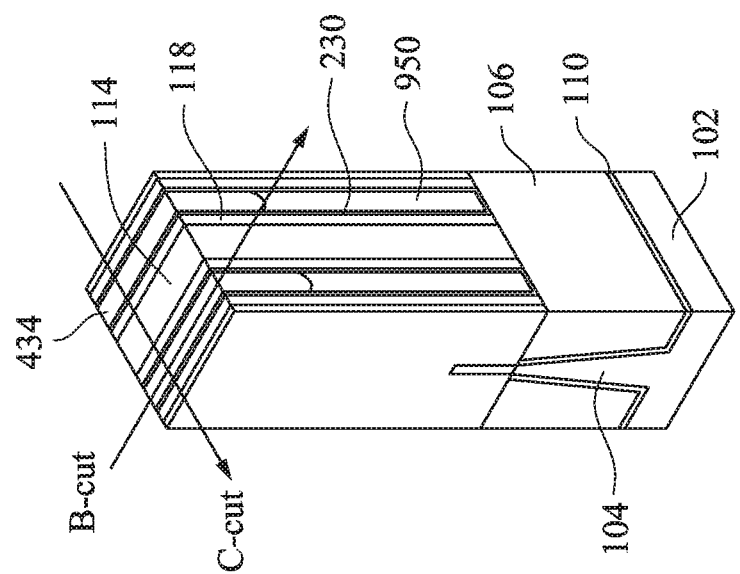
Figure 22C:
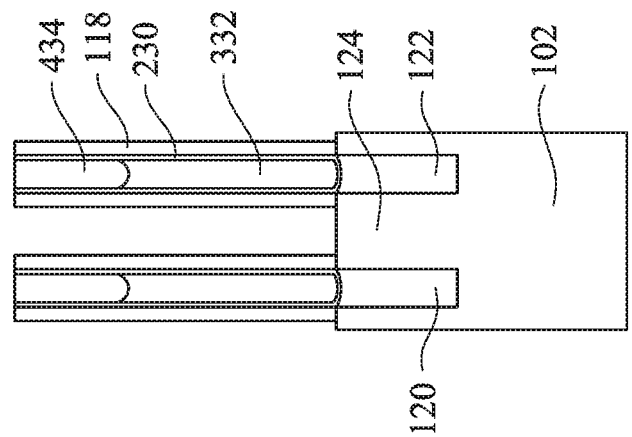
Figure 22B:
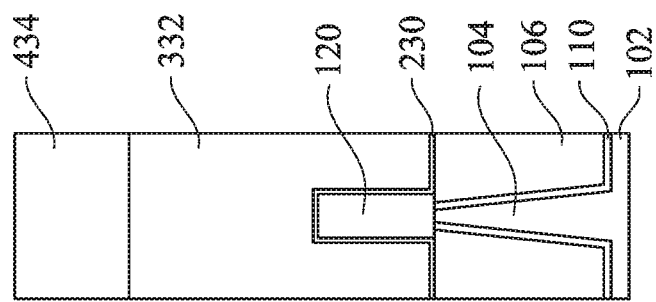
Figure 22A:
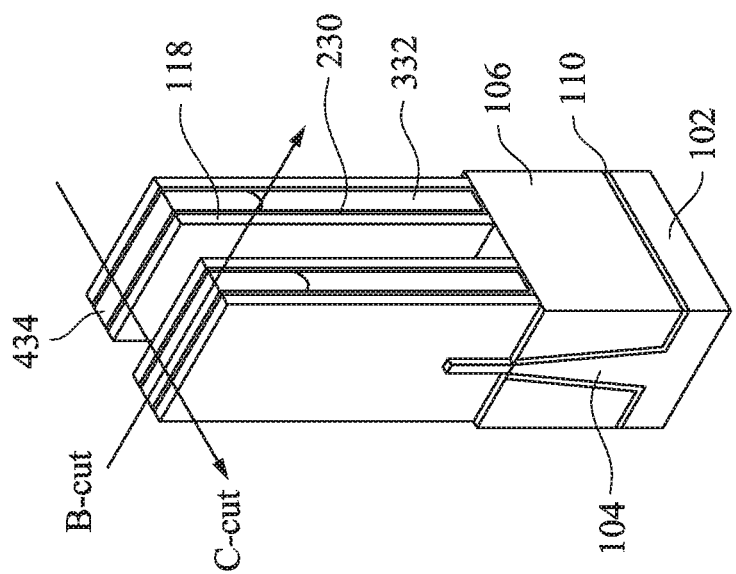
Figure 23C:
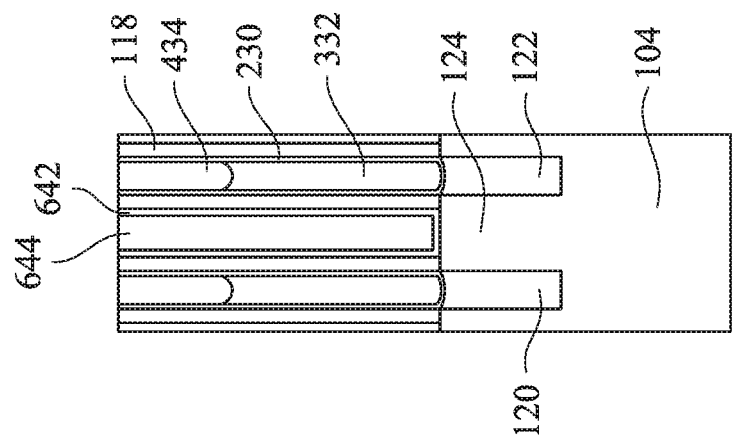
Figure 23B:
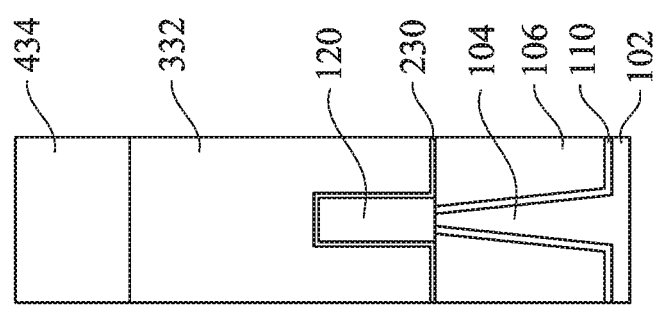
Figure 23A:
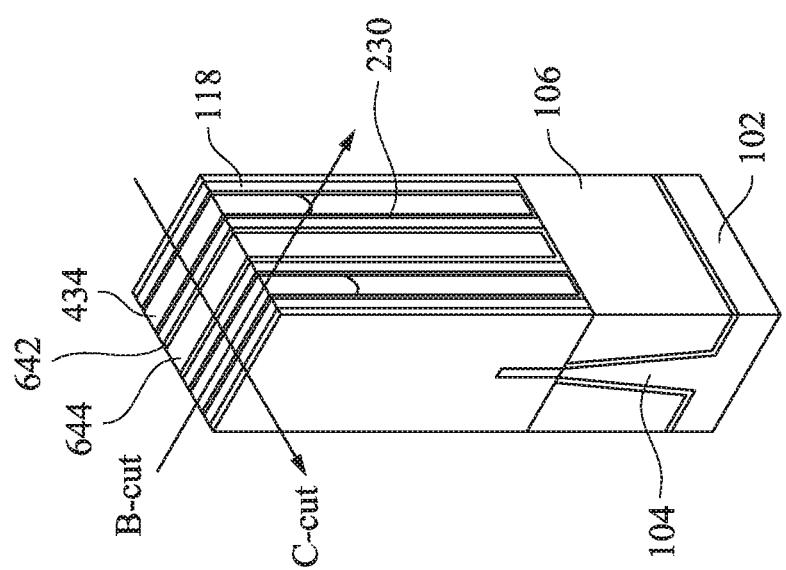
Figure 24C:
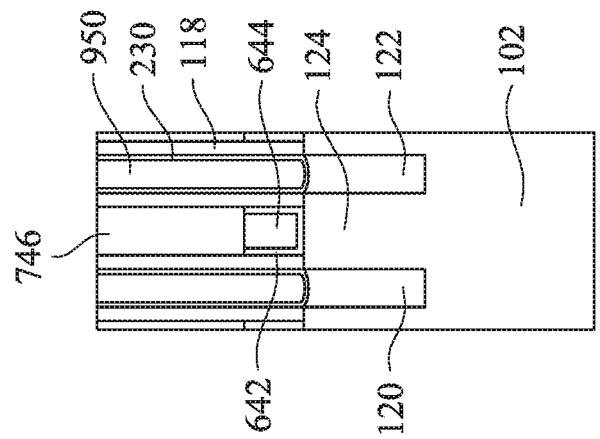
Figure 24B:
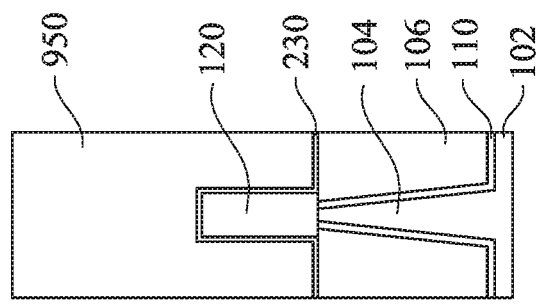
Figure 24A:
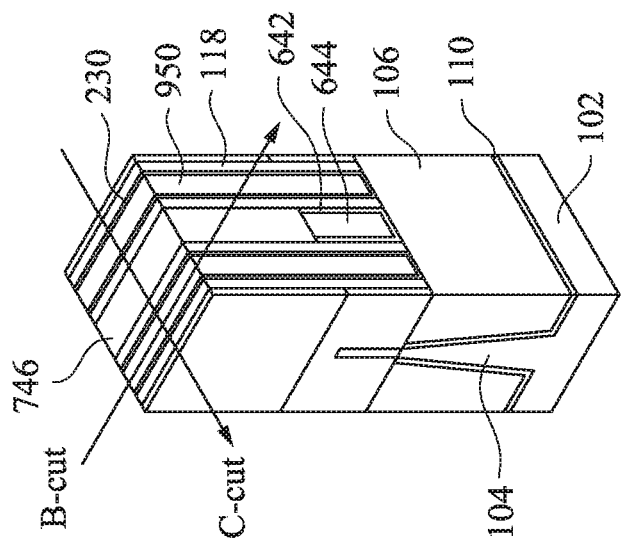

FIGS. 21A-21C illustrates a recessing of the sacrificial film 950 in accordance with some embodiments. As discussed in greater detail below, the sacrificial film 950 is recessed and a mask is formed over the recessed sacrificial film 950 to protect the sacrificial film 950 during subsequent processing. In some embodiments, the sacrificial film 950 is recessed from 100 Å to about 600 Å in order to provide a sufficient thickness for the subsequently formed mask layer.

In embodiments in which the sacrificial film 950 is formed of polysilicon and the dummy gate mask 116, the liner dielectric film 230 and the sidewall spacers 118 are formed of silicon nitride/silicon oxide, the sacrificial film 950 may be recessed using a timed etch, using for example plasma etching with a process gas may of $NF_3$, $HBr/N_2/O_2$, or $Cl_2/NF_3/He$, at a temperature of less than 200° C. (e.g., less than 100° C.), an RF power of less than 3 kW (e.g., less than 600 W), and at a pressure of less than 10 torr (e.g., less than 3 torr).

As another example, in some embodiments the sacrificial film 950 is formed of SiOC formed by spin-on coating, and the dummy gate mask 116, the liner dielectric film 230 and the sidewall spacers 118 are formed of silicon nitride/silicon oxide, the sacrificial film 950 may be recessed using a timed etch, using for example plasma etching with a process gas including $N_2$ and $H_2$, or $SO_2$ and $O_2$, at a temperature of less than 200° C. (e.g., 20-100° C.), an RF power of greater than 100 W (e.g., greater than 300 W), and at a pressure of less than 3 torr (e.g., less than 200 mtorr).

As yet another example, in some embodiments the sacrificial film 950 is formed of silicon oxide formed by flowable CVD, and the dummy gate mask 116, the liner dielectric film 230 and the sidewall spacers 118 are formed of silicon nitride, the sacrificial film 950 may be recessed using a timed etch, using for example a plasma etch process with a process gas including $C_4F_6$ or a fluorine-based gas, at a temperature of less than 200° C. (e.g., less than 150° C.), an RF power of greater than 50 W (e.g., greater than 100 W), and at a pressure of less than 3 torr (e.g., less than 200 mtorr).

As yet another example, in some embodiments the sacrificial film 950 is formed of germanium, and the dummy gate mask 116, the liner dielectric film 230 and the sidewall spacers 118 are formed of silicon nitride/silicon oxide, the sacrificial film 950 may be recessed using a timed etch, using for example a plasma etch process with a process gas including CF4 chemistry (e.g., $CF_2Cl_2$, $CF_3Br$, or the like, or HBr, $Cl_2$ or other halogen gases, at a temperature of less than 200° C. (e.g., less than 60° C.), an RF power of greater than 2,000 kW (e.g., from about 50 W to about 300 W), and at a pressure of less than 10 torr (e.g., less than 500 mtorr).

Figure 19C:
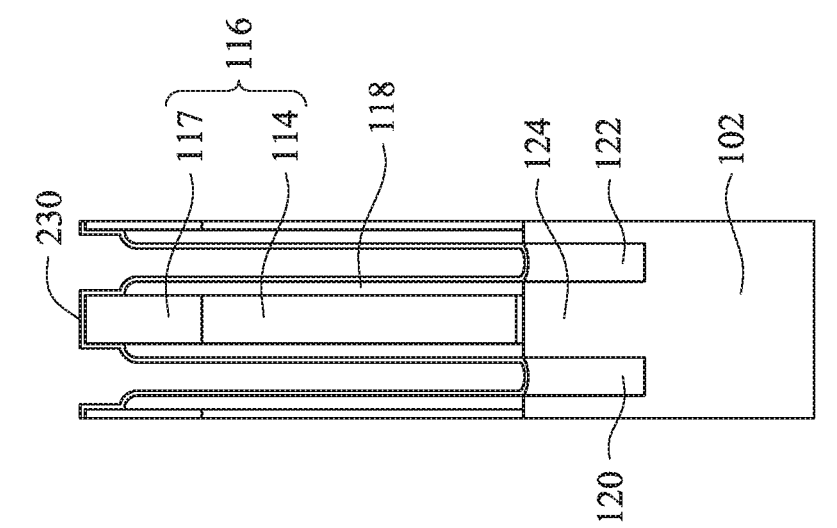
Figure 19B:
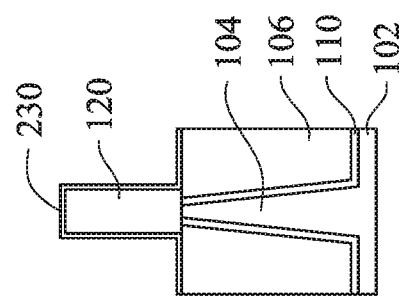
Figure 19A:
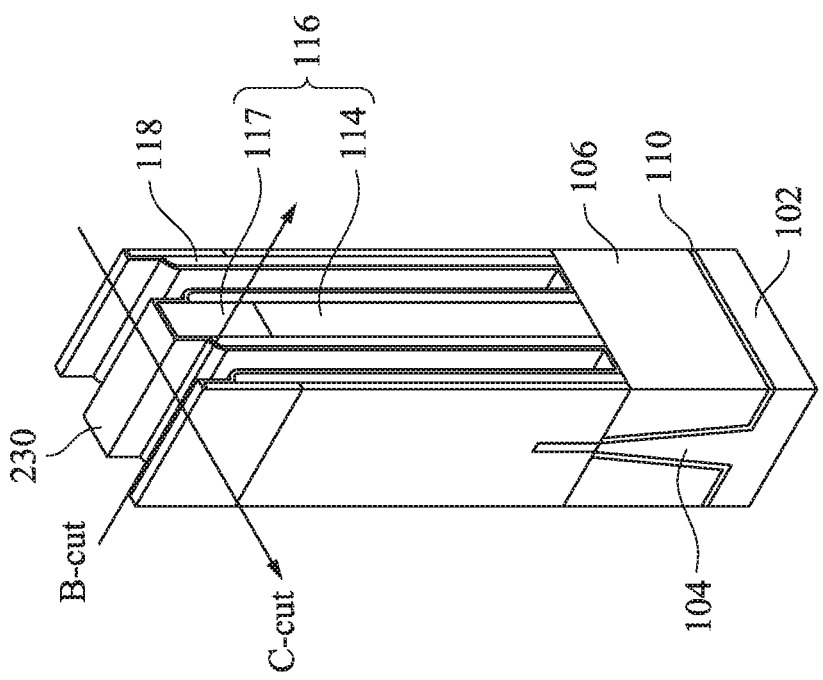

A planarization process, such as a CMP process, may be performed to expose the dummy gate mask 117 (see FIGS. 19A-19C). In some embodiments, the planarization process may continue to remove the dummy gate mask 117 and to expose the dummy gate electrode 114 as illustrated in FIGS. 21A-21C.

Thereafter, processing similar to that discussed above with reference to FIGS. 5A-7C may be performed as illustrated in FIGS. 22A-24C, respectively. Similar processes and materials may be used as described above and will not be repeated.

Figure 25C:
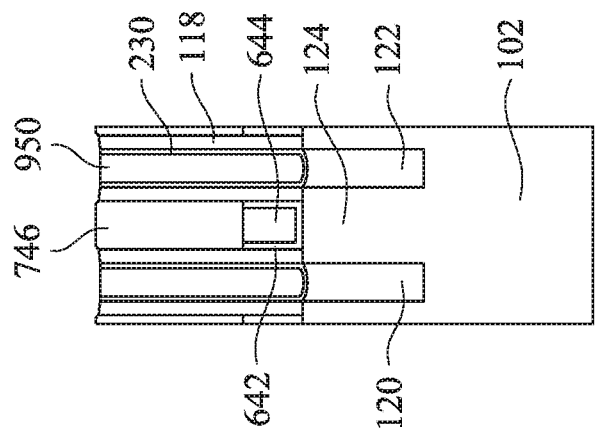
Figure 25B:
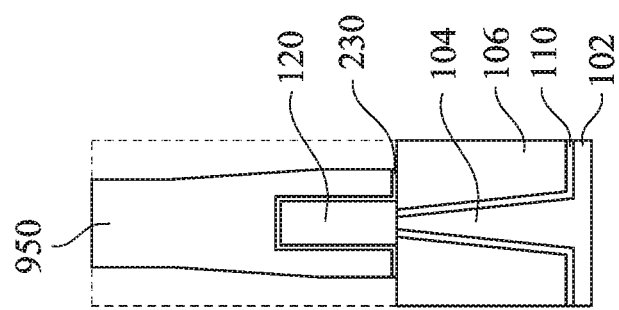
Figure 25A:
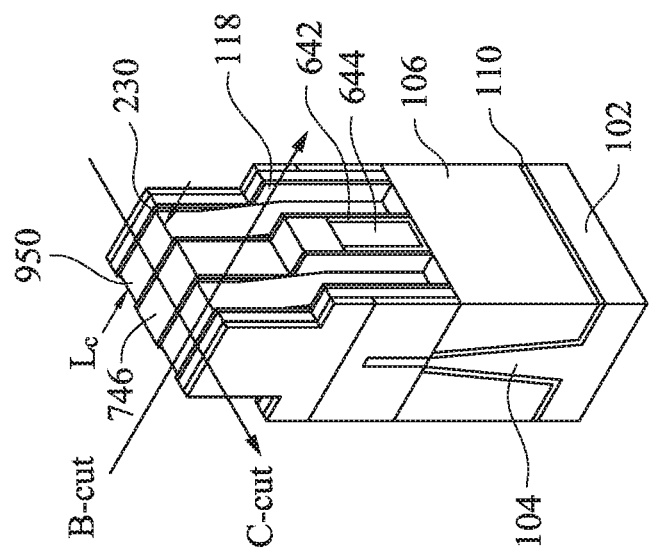

Referring now to FIGS. 25A-25C, the sacrificial film 950 is patterned in accordance with some embodiments. The sacrificial film 950 may be patterned as discussed above with reference to FIGS. 10A-10C and will not be repeated. It is noted that in embodiments such as these, the processes discussed above with reference to FIGS. 3 and 8 (forming and then removing the sacrificial inter-gate film 332 to form the sacrificial film 950) may be omitted.

Thereafter, processes illustrated in FIGS. 26A-28D may be performed. The processes may be similar to those discussed above with reference to FIGS. 11A-13D, respectively, and will not be repeated.

Processes discussed above with reference to FIGS. 14A-15B to form a funnel-shaped opening in the contact isolation region and/or with reference to FIGS. 16A-17B to form a funnel-shaped opening in the contact region may be incorporated into the process discussed above with reference to FIGS. 18A-28C. For example, after performing processes discussed above with reference to FIGS. 18A-25C, the processes discussed above with reference to FIGS. 14A-15B may be performed. Accordingly, after performing processes discussed above with reference to FIGS. 18A-25C, an additional etch process may be performed to laterally widen an upper portion of the opening above the contact isolation region while portions of the sacrificial film 950 over the source/drain regions are protected as discussed above with reference to FIGS. 25A-25C. As illustrated in FIG. 14A-14B, the second etch may laterally remove upper portions of the sidewall spacers 118 and portions of the remaining gate electrode mask 746, thereby creating a funnel-shaped opening profile. The funnel-shaped opening profile allows part of the sidewall spacers 118 and the gate electrode mask 746 to be replaced with a lower dielectric constant material, thereby reducing the fringing capacitance between the gate electrode 644 and the contact 1358 and improving device performance.

In some embodiments in which the sidewall spacers 118 and the gate electrode mask 746 are formed of silicon nitride, a lateral dry etch plasma process using a process gas of $CF_4$ chemistry (e.g., $CF_2Cl_2$, $CF_3Br$, or the like), at a temperature of less than 250° C. (e.g., less than 150° C.), an RF power of greater than 3 kW (e.g., less than 2 kW), and at a pressure of less than 5 torr (e.g., less than 2.5 torr) may be performed. In some embodiments, the height ($H_A$) and width ($W_A$) are greater than 4 nm and greater than 2 nm, respectively.

Thereafter, processes such as those discussed above with reference to FIGS. 26A-26C may be performed to fill the funnel-shaped opening with the ILD material (e.g., the ILD liner 1152 and the ILD filler material 1154), thereby resulting in the structure illustrated in FIGS. 15A-15B. Processes such as those discussed above with reference to FIGS. 26A-28D may be performed to complete formation of the contacts.

The processes discussed above with reference to FIGS. 16A-17B may also be incorporated into the process discussed above with reference to FIGS. 18A-28C to form a funnel-shaped contact. For example, after performing processes discussed above with reference to FIGS. 18A-27C, but prior to removing the liner dielectric film 230, an additional etch process may be performed to laterally widen an upper portion of the opening above the contact region of the source/drain regions. As illustrated in FIG. 16A-16B, the second etch may laterally remove upper portions of sidewall spacers 118 and portions of the gate electrode mask 746, thereby creating a funnel-shaped opening profile as shown in FIGS. 16A-16B. The ILD liner 1152 may be removed from over the source/drain regions as discussed above with reference to FIGS. 27A-27C.

In some embodiments in which the ILD liner 1152 and the gate electrode mask 746 are formed of silicon nitride, a lateral dry etch plasma process using a process gas of $CF_4$ chemistry (e.g., $CF_2Cl_2$, $CF_3Br$, or the like), at a temperature of less than 250° C. (e.g., less than 150° C.), an RF power of greater than 3 kW (e.g., less than 2 kW), and at a pressure of less than 5 torr (e.g., less than 2.5 torr) may be used. In some embodiments, the height ($H_B$) and width ($W_B$) may be less than 7 nm and less than 3 nm, respectively. In some embodiments, $H_B$ and $W_B$ may be greater than $H_A$ and $W_A$ respectively. The funnel-shaped opening may then be filled with a conductive material as discussed above with reference to FIGS. 28A-28D, thereby resulting in a contact as illustrated in FIGS. 17A-17B.

Other processes may be performed. For example, in some embodiments a metal silicide may be formed over the first source/drain regions 930 and the second source/drain regions 932. In some embodiments a metal silicide formation process is performed after the inter-gate film removal process discussed above with reference to FIGS. 8A-8C, or after the contact hole formation discussed above with reference to FIGS. 12A-12C. The metal silicide formation process may form a metal silicide on top of the doped source/drain region to reduce $R_c$ between the doped source/drain regions and the contact metal formed thereafter. The metal silicide formation process includes a metal film deposition on top of the source/drain region, a thermal treatment to form a metal silicide at the interface between the source/drain region and an etching process to remove the excess unreacted metal. The metal silicide comprises $TiSi_x$, $NiSi_x$, $CoSi_x$, $NiCoSi_x$, and $TaSi_x$, but other suitable silicide materials may be used. In some embodiments, the silicide formation may be performed ILD removal.

In an embodiment, a method of forming a semiconductor device is provided. The method includes forming a sacrificial film over a source/drain region of a fin and an isolation region adjacent the fin, removing a first portion of the sacrificial film over the isolation region to form a first recess, a second portion of the sacrificial film over the source/drain region remaining, and forming a dielectric layer in the first recess. The method further includes removing the second portion of the sacrificial film to form a second recess and forming a conductive layer in the second recess.

In another embodiment, a method of forming a semiconductor device is provided. The method includes forming a first gate electrode and a second gate electrode over a semiconductor structure, forming a first sacrificial film between the first gate electrode and the second gate electrode, and patterning the first sacrificial film such that a remaining portion of the first sacrificial film remains over the semiconductor structure and such that first recesses are formed between the first gate electrode and the second gate electrode on opposing sides of the remaining portion of the first sacrificial film. The method further includes forming an interlayer dielectric (ILD) in the first recesses, removing the remaining portion of the first sacrificial film to form a second recess, and forming a conductive feature in the second recess.

In another embodiment, a semiconductor device is provided. The semiconductor device includes a gate electrode over a semiconductor structure, the semiconductor structure having a first source/drain region, a second source/drain region, and a channel region interposed between the first source/drain region and the second source/drain region, the gate electrode being over the channel region, a gate mask over the gate electrode, and a sidewall spacer along a sidewall of the gate electrode and the gate mask, wherein an upper surface of the sidewall spacer is recessed from an upper surface of the gate mask. The semiconductor device further includes a contact adjacent the sidewall spacer, the contact electrically coupled to the first source/drain region, wherein the contact contacts a sidewall of an upper portion of the gate mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a gate electrode over a semiconductor structure, the semiconductor structure having a first source/drain region, a second source/drain region, and a channel region interposed between the first source/drain region and the second source/drain region, the gate electrode being over the channel region;
   a gate mask over the gate electrode;
   a sidewall spacer along a sidewall of the gate electrode and the gate mask, wherein an upper surface of the sidewall spacer is recessed from an upper surface of the gate mask; and
   a contact adjacent the sidewall spacer, the contact electrically coupled to the first source/drain region, wherein the contact contacts a sidewall of an upper portion of the gate mask, wherein the contact has a first tapered profile along a cross section parallel to the gate electrode such that a first outermost width of the contact decreases as the contact extends away from the first source/drain region, wherein the contact has a second tapered profile along a cross section perpendicular to the gate electrode such that a second outermost width of the contact increases as the contact extends away from the first source/drain region.

2. The semiconductor device of claim 1, further comprising an ILD layer adjacent the contact, the ILD layer extending over at least a portion of the gate mask.

3. The semiconductor device of claim 2, wherein a width of the gate mask along an upper surface of the gate mask is narrower than a width of the gate mask along a surface of the gate mask adjacent the gate electrode.

4. The semiconductor device of claim 1, wherein the contact extends laterally over and laterally adjacent the sidewall spacer.

5. The semiconductor device of claim 1, wherein the contact extends laterally over and laterally adjacent a portion of the gate mask.

6. The semiconductor device of claim 1, wherein the contact has a funnel-shaped profile along a cross section perpendicular to the gate electrode such that an outermost width of the contact decreases as the contact extends from an upper surface of contact to the first source/drain region.

7. The semiconductor device of claim 3, wherein the ILD layer extends from a first sidewall of the gate mask to a second sidewall of the gate mask, wherein the first sidewall and the second sidewall are opposite sidewalls.

8. A semiconductor device comprising:
   a gate electrode over a fin, the fin having a first source/drain region, a second source/drain region, and a channel region interposed between the first source/drain region and the second source/drain region, the gate electrode being over the channel region;
   a gate mask over the gate electrode;
   a sidewall spacer along a sidewall of the gate electrode and the gate mask; and
   a contact adjacent the sidewall spacer, wherein an upper surface of the contact has a first outermost dimension and a bottom surface of the contact has a second outermost dimension, wherein the first outermost dimension is less than the second outermost dimension, wherein the first outermost dimension and the second outermost dimension is measured along a direction parallel to the gate electrode, wherein the upper surface of the contact has a third outermost dimension and the bottom surface of the contact has a fourth outermost dimension, wherein the third outermost dimension is greater than the fourth outermost dimension, wherein the third outermost dimension and the fourth outermost dimension is measured along a direction perpendicular to the gate electrode.

9. The semiconductor device of claim 8, wherein the first source/drain region and the second source/drain region comprises epitaxial regions.

10. The semiconductor device of claim 8, wherein the contact has a funnel shape along a direction perpendicular to the gate electrode.

11. The semiconductor device of claim 10, wherein the contact completely covers an upper surface of the sidewall spacer.

12. The semiconductor device of claim 11, wherein the contact covers at least a portion of an upper surface of the gate mask.

13. The semiconductor device of claim 8, wherein the gate mask protrudes above the sidewall spacer.

14. The semiconductor device of claim 8, further comprising an ILD filler, an upper surface of the ILD filler being level with an upper surface of the contact.

15. The semiconductor device of claim 14, wherein the ILD filler extends over the gate mask.

16. A semiconductor device comprising:
a gate electrode over a fin, the fin having a first source/drain region, a second source/drain region, and a channel region interposed between the first source/drain region and the second source/drain region, the gate electrode being over the channel region;
a gate mask over the gate electrode;
a sidewall spacer along a sidewall of the gate electrode and the gate mask;
a contact adjacent the sidewall spacer; and
an ILD filler adjacent the sidewall spacer, the ILD filler extending over the gate mask, the ILD filler having an upper surface level with an upper surface of the contact, wherein the contact is narrower at an upper surface than at a bottom surface along a first direction, wherein the contact has a funnel shape along a second direction.

17. The semiconductor device of claim 16, wherein the ILD filler has a funnel shape along the first direction.

18. The semiconductor device of claim 16, wherein the contact extends from a first sidewall of the sidewall spacer to a second sidewall of the sidewall spacer.

19. The semiconductor device of claim 16 further comprising an ILD liner, wherein the ILD liner is interposed between the ILD filler and the contact.

20. The semiconductor device of claim 19, wherein the ILD liner extends between the ILD filler and the gate mask.

* * * * *